United States Patent [19]
Miyashita

[11] Patent Number: 5,436,196
[45] Date of Patent: Jul. 25, 1995

[54] METHOD OF PRODUCING SEMICONDUCTOR LASER

[75] Inventor: Motoharu Miyashita, Itami, Japan

[73] Assignee: Mitsubishi Denki Kabushiki Kaisha, Tokyo, Japan

[21] Appl. No.: 318,544

[22] Filed: Oct. 5, 1994

[30] Foreign Application Priority Data

Oct. 5, 1993 [JP] Japan .................. 5-248921

[51] Int. Cl.$^6$ ............................................. H01L 21/20
[52] U.S. Cl. ......................................... 437/129; 437/126; 437/133; 148/DIG. 55
[58] Field of Search ............... 437/129, 126, 133; 148/DIG. 95; 372/43, 45, 46, 47

[56] References Cited

U.S. PATENT DOCUMENTS

| | | | |
|---|---|---|---|
| 4,888,085 | 12/1989 | Smith | 437/129 |
| 4,895,615 | 1/1990 | Muschke | 437/129 |
| 5,089,437 | 2/1992 | Shima et al. | 437/129 |
| 5,171,706 | 12/1992 | Matsumoto et al. | 437/129 |
| 5,242,856 | 9/1993 | Kurihara et al. | 148/DIG. 95 |
| 5,272,109 | 12/1993 | Motoda | 437/133 |
| 5,316,967 | 5/1994 | Kaneno et al. | 437/133 |
| 5,346,854 | 9/1994 | Ahn et al. | 372/43 |

FOREIGN PATENT DOCUMENTS

| | | | |
|---|---|---|---|
| 54-7891 | 1/1979 | Japan | 437/129 |
| 59-11690 | 1/1984 | Japan | 437/129 |
| 59-181587 | 10/1984 | Japan | 437/129 |

OTHER PUBLICATIONS

Sasaki et al, "Highly Reliable 150 mW CW Operation Of Single-Stripe AlGaAs Lasers With Window Grown On Facets", Japanese Journal of Applied Physics, vol. 30, No. 5B, May 1991, pp. L904–L906.

*Primary Examiner*—Kevin M. Picardat
*Attorney, Agent, or Firm*—Leydig, Voit & Mayer

[57] ABSTRACT

In a method of fabricating a semiconductor laser, a laminated layer structure including a double heterojunction, having an active layer sandwiched by an upper and a lower cladding layer, is formed on a semiconductor wafer. An insulating film is formed with a pattern including a first to-be-processed region corresponding to respective chip regions including a ridge formation region and a second to-be-processed region corresponding to edge regions of the respective chip regions. Apertures are formed in the insulating film at both sides of the ridge formation region of the laser element at the first to-be-processed region having a large insulating film aperture ratio and at the light emitting facet formation region of the laser element at the second to-be-processed region having a small insulating film aperture ratio. The semiconductor layers exposed through the insulating film apertures are etched with a chemically reactive gas having an increased etching speed at a smaller insulating film aperture ratio. Therefore, the active layer is not exposed at both sides of the ridge and the characteristics of the laser element are not deteriorated due to the deterioration of the semiconductor layer exposed in the etching process.

15 Claims, 20 Drawing Sheets

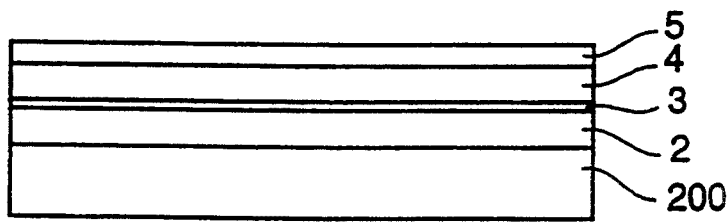
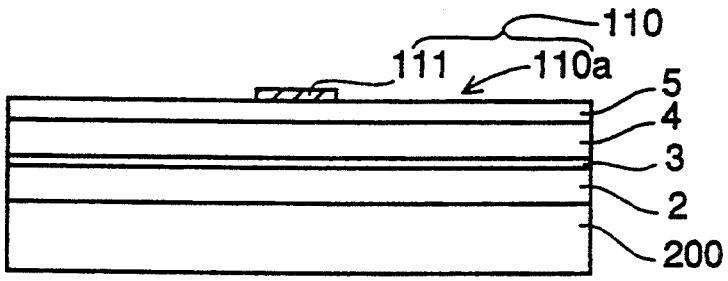
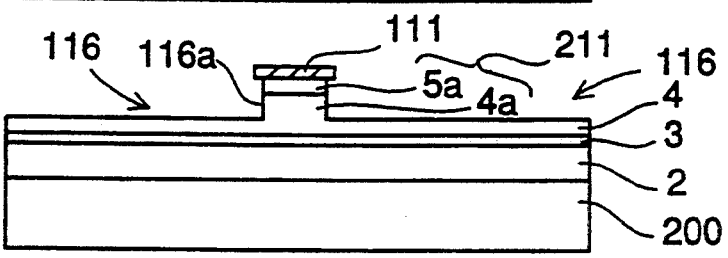
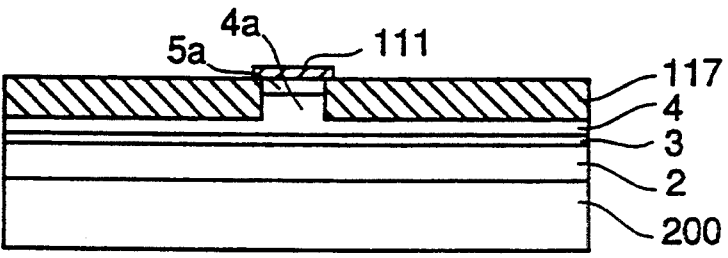
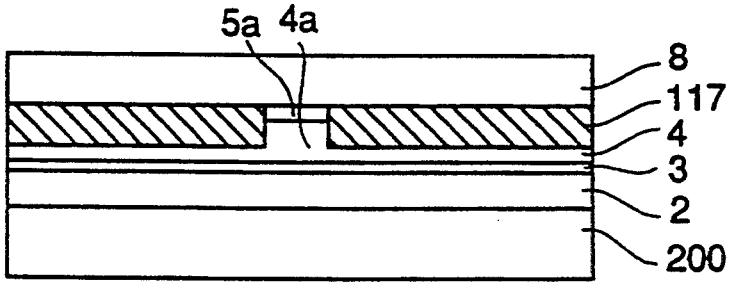
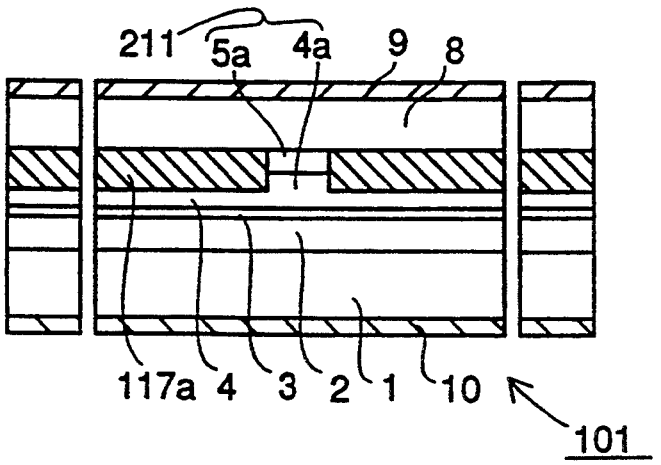

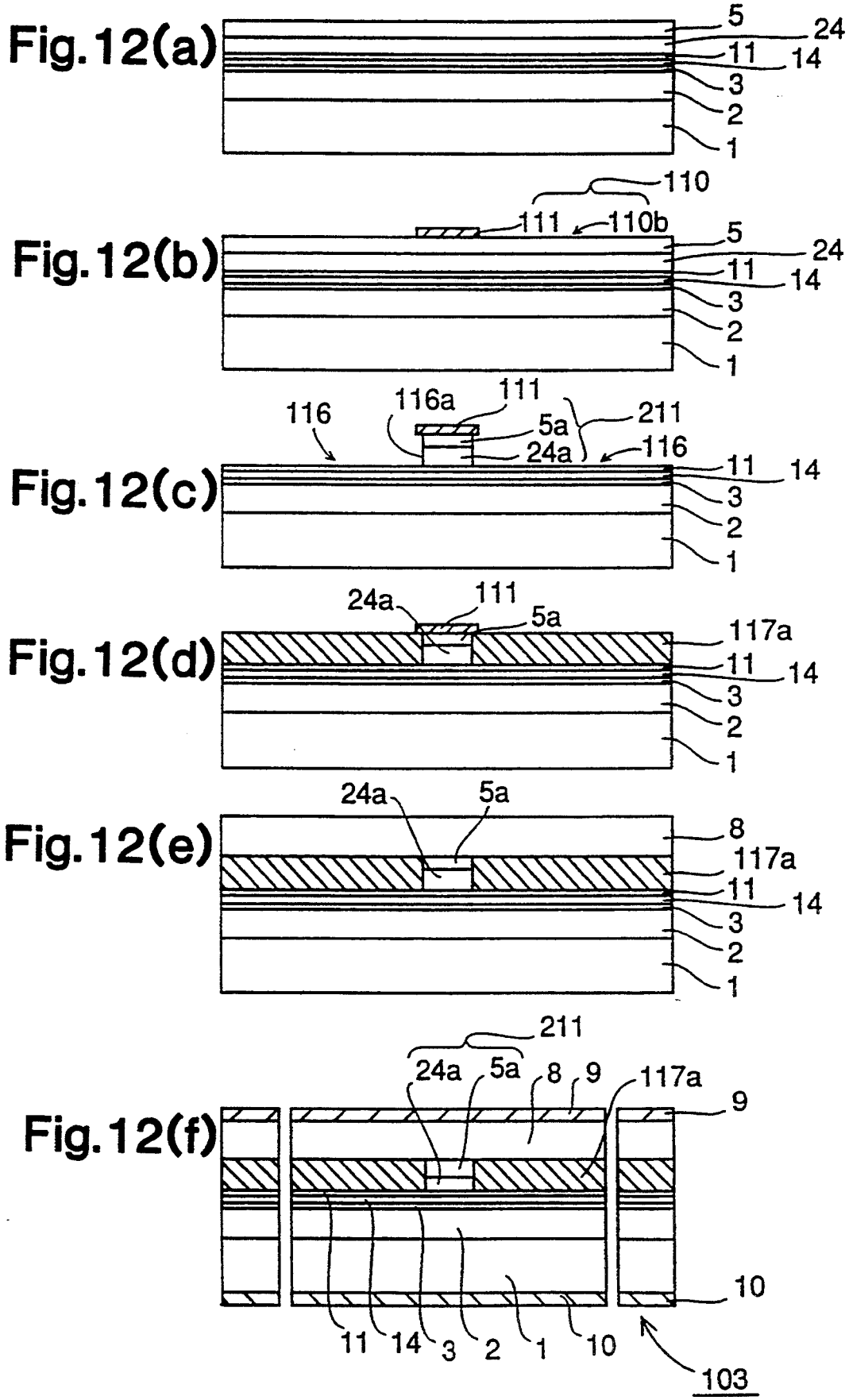

METHOD OF PRODUCING SEMICONDUCTOR LASER

FIELD OF THE INVENTION

The present invention relates to a method for fabricating a semiconductor laser and, more particularly, to a method for fabricating a ridge type semiconductor laser having a window layer having an energy band gap larger than that corresponding to the wavelength of the emitted laser light at its light emitting facet.

BACKGROUND OF THE INVENTION

Conventionally, a type of a semiconductor laser includes an active layer facet portion comprising a semiconductor material having a larger energy band gap than that of other regions of the active layer so that the active layer facet portion is prevented from serving as a light absorbing region due to surface levels existing at the active layer facet portion so that the active layer facet portion serves as a window layer not absorbing emitted laser light.

FIG. 13 is a perspective view illustrating a structure of a prior art ridge type semiconductor laser having a window layer partly in cross-section disclosed in, for example, Japanese Journal of Applied Physics, 30 (1991),pp. L904~L906. FIGS. 14(a)-14(f) and FIGS. 15(a)-15(f) are diagrams for explaining fabrication methods of these semiconductor lasers, respectively, for respective major process steps, wherein FIGS. 14(a)-14(f) illustrate structures in cross-section parallel with the resonator length direction of the laser structure (a cross-section along line 14—14 of FIG. 13), and FIGS. 15(a)-15(f) respectively illustrate structures in cross-section perpendicular to the resonator length direction of the laser structure. FIGS. 16(a) and 16(b) and FIGS. 17(a) and 17(b) are diagrams for explaining the processes for dicing the laser elements formed on the semiconductor wafers into respective chips, where FIGS. 16(a) and 16(b) illustrate a manner of cleaving the semiconductor wafer along a direction perpendicular to the resonator direction of respective laser elements, FIG. 17(a) illustrates a manner of forming a window layer on the cleaved facet, and FIG. 17(b) illustrates a manner of separating the wafer pieces obtained by the cleavage into respective chips.

In these figures, reference numeral 200 designates an n type GaAs wafer on an upper surface of which a plurality of chip regions 200a each for producing a ridge type semiconductor laser chip having a window layer are formed, and reference numeral 201 designates ridge type semiconductor laser chips each having a window layer and emitting the laser light L, which are respectively formed on the chip regions 200a of the wafer 200 and diced from the wafer 200.

The laser chip 201 has a laminated layer structure comprising an n type AlGaAs lower cladding layer 2, an undoped AlGaAs active layer 3, and a p type AlGaAs upper cladding layer 4 formed on an n type GaAs substrate 1. The upper cladding layer 4 has a linear projecting portion 4a extending in the resonator length direction at a central portion thereof, and this linear projecting portion 4a and the p type GaAs cap layer 5a covering the upper surface thereof forms a ridge 211 of the laser chip 201, and n type GaAs current blocking layers 7a are formed on the upper cladding layer 4 at both sides of the ridge 211.

A p type GaAs contact layer 8 is formed on the entire surface of the current blocking layers 7a and the ridge 211, and a surface electrode 9 0.1 to 0.3 μm thick comprising a Ti/Pt/Au laminated layer film is formed thereon. A rear surface electrode 10 0.1 to 0.3 μm thick comprising an AuGe/Ni/Au laminated layer film is formed on the rear surface of the chip substrate 1 and an undoped AlGaAs window layer 7b is formed at the light emitting facet of the laser chip 201.

The lower cladding layer 2, the active layer 3, and the upper cladding layer 4 are, for example, about 1.5 μm, 0.03 m, and 1.5 μm, thick respectively, and the n type lower cladding layer 2 has an impurity (Se) concentration of about $5 \times 10^{17}$ cm$^{-3}$ and the p type upper cladding layer 4 has a dopant impurity (Zn) concentration of about $1 \times 10^{18}$ cm$^{-3}$.

The p type cap layer 5 is 0.5 μm thick and has a dopant impurity (Zn) concentration of about $1 \times 10^{19}$ cm$^{-3}$, and the p type contact layer 8 is 1.5 μm thick and has a dopant impurity (Zn) concentration of about $1 \times 10^{19}$ cm$^{-3}$. The current blocking layer 7a is 1.7 μm thick and has a dopant impurity (Si) concentration of $2 \times 10^{18}$ cm$^{-3}$ and the window layer 7b is about several hundreds Å long in the resonator length direction.

A description is given of the fabrication process.

First of all, an n type AlGaAs lower cladding layer 2, an undoped AlGaAs active layer 3, a p type AlGaAs upper cladding layer 4, and a p type GaAs cap layer 5 are successively grown on the n type GaAs wafer 200 to the respective above-described thicknesses by MOCVD or the like (FIG. 14(a), FIG. 15(a)).

A SiN film is deposited on the entire surface, about 0.1 μm thick, by CVD method and, thereafter, the SiN film is patterned by photolithography and selective etching, whereby a SiN film 6 serving as an etching mask is formed only at a portion corresponding to the ridge 211 of each chip region 200a which is assigned on the wafer substrate 200 (FIG. 14(b), FIG. 15(b)). Subsequently, employing the stripe-shaped SiN film 6 as an etching mask, the p type cap layer 5 and the p type upper cladding layer 4 are etched to about 0.3 μm height on the undoped active layer 3, thereby forming a ridge 211 (FIG. 14(c), FIG. 15(c)).

Employing the stripe-shaped SiN film 6 as a selective growth mask, an n type GaAs current blocking layer 7a is grown to about 1.7 μm thick by MOCVD or the like (FIG. 14(d), FIG. 15(d)). Thereafter, the stripe-shaped SiN film 6 is removed, and the p type GaAs contact layer 8 is grown on the entire surface on the ridge 211 and the n type current blocking layers 7a by crystal growth (FIG. 14(e), FIG. 15(e)).

Then, Ti, Pt, and Au are laminated on the p type contact layer 8 to form a surface electrode 9, AuGe/Ni/Au is laminated on the rear surface of the wafer to form a rear surface electrode 10, and, thereafter, chip separation and formation of a window layer 7b are performed (FIG. 14(f), FIG. 15(f)), as described in detail below.

First of all, the wafer 200 is separated by cleavage along the direction X perpendicular to the resonator length direction to form wafer divided pieces 201a~201g (FIG. 16(a), 16(b)). Respective wafer divided pieces are made to stand as shown in FIG. 17(a), and an undoped AlGaAs window layer 7b is grown on the surface to be a laser facet by crystal growth. Thereafter, respective wafer divided pieces 201d having the window layer 7b are divided into respective chips by cleavage or dicing along the resonator length direction as shown in FIG. 17(b) and 17(c). Thus a ridge type semiconductor laser chip 201 having a window layer is formed.

A description is given of another fabrication process for a prior art ridge type semiconductor laser having a window layer.

FIG. 18 is a perspective view partly in cross-section illustrating a structure of a ridge type semiconductor laser having a window layer fabricated by a process different from that described above, and FIGS. 19(a)–19(f) and FIGS. 20(a)–20(f) are diagrams for explaining the fabrication process in major process steps. More particularly, FIGS. 19(a)–19(f) illustrate structures in cross section parallel to the resonator length direction in the laser structure (in cross-section along line 19—19 in FIG. 18), and FIGS. 20(a)–20(f) illustrate structures in cross section vertical to the resonator length direction in the laser structure (in cross-section along line 20—20 of FIG. 18) in respective major process steps.

In these figures, reference numeral 202 designates a ridge type semiconductor laser chip having a window layer. This laser chip 202 includes a laminated layer structure comprising an n type AlGaAs lower cladding layer 2, an undoped AlGaAs active layer 3, and a p type AlGaAs upper cladding layer 4 formed on an n type GaAs chip substrate 1, similarly as the laser chip 201 shown in FIGS. 13 to 15. The ridge 212 of the laser chip 202 includes a linear projecting portion 2a extending in the resonator length direction formed at the central portion of the lower cladding layer 2, and an undoped active layer 3a, an upper cladding layer 4a, and a p type GaAs cap layer 5a covering the surface of the upper cladding layer 4a which are successively laminated on the linear projecting portion 2a. N type AlGaAs current blocking layers 17a are formed on the lower cladding layer 2 at both sides of the ridge 212 and an n type AlGaAs window layer 17b is formed on the lower cladding layer 2 at the side of the laser emitting facet of the ridge 212.

A p type GaAs contact layer 8 is formed on the entire surface of the current blocking layers 17a and the ridge 212, and a surface electrode 9 comprising a Ti/Pt/Au laminated layer film is formed thereon. At the rear surface side of the chip substrate 1, a rear surface electrode 10 comprising an AuGe/Ni/Au laminated layer film is formed. The other construction is the same as that shown in FIGS. 13 to 15(f).

A description is given of the fabrication method.

First of all, an n type AlGaAs lower cladding layer 2, an undoped AlGaAs active layer 3, a p type AlGaAs upper cladding layer 4, and a p type GaAs cap layer 5 are successively grown on an n type GaAs wafer 200 to predetermined thicknesses by crystal growth such as MOCVD (FIG. 19(a), FIG. 20(a)).

SiN is deposited on the entire surface by CVD or the like, and the SiN film is patterned by photolithography and etching so that a portion corresponding to the ridge 212 of the laser structure remains and an aperture 16a is formed on an extension line of the ridge at the chip region end, whereby a SiN film 16 serving as an etching mask as well as a selective growth mask is formed (FIG. 19(b), FIG. 20(b)).

Employing the SiN film 16 as a mask, surface portions of the p type GaAs cap layer 5, the p type AlGaAs upper cladding layer 4, the undoped AlGaAs active layer 3, and the p type AlGaAs lower cladding layer 2 are etched to expose the side surfaces of the active layer 3, thereby forming the ridge 212 (FIG. 19(c), FIG. 20(c)).

Employing the SiN film 16 as a selective growth mask, a high resistivity AlGaAs layer 17 is grown on the n type lower cladding layer 2 exposed by etching at both sides of the ridge 212 and at the side of the light emitting facet by MOCVD or the like, whereby current blocking layers 17a are formed at both sides of the ridge 212 and a window layer 17b is formed at the side of the light emitting facet (FIG. 19(d), FIG. 20(d)).

After the SiN film 16 is removed, a p type GaAs contact layer 8 is formed over the ridge 212, the current blocking layers 17a, and the window layer 17b by crystal growth (FIG. 19(e), FIG. 20(e)), and thereafter the front surface electrode 9 and the rear surface electrode 10 are formed.

As shown in FIGS. 16(a) and 16(b), as in the prior art fabrication method described with reference to FIGS. 14(a) to 14(f) and FIGS. 15(a) to 15(f), the wafer 200 is separated by cleavage along a direction perpendicular to the resonator length direction to form a light emitting facet of the laser element of the respective chip regions 200a, and as shown in FIG. 17(c), respective wafer divided pieces 201d are cut out into respective chips by cleavage or dicing along the resonator length direction, thereby resulting in a ridge type semiconductor laser chip having a window layer 202.

In the prior art fabrication method of a semiconductor laser shown in FIGS. 14(a) to 14(f) and FIGS. 15(a) to 15(f), it is required to carry out four crystal growths, i.e., a first one for forming the n type AlGaAs lower cladding layer 2, the undoped AlGaAs active layer 3, the p type AlGaAs upper cladding layer 4, and the p type GaAs cap layer 5 on the n type GaAs wafer 200 (FIG. 14(a), FIG. 15(a)), a second one for forming the n type AlGaAs current blocking layer 7a (FIG. 14(d), FIG. 15(d)), a third one for forming the p type GaAs contact layer 8 (FIG. 14(e), FIG. 15(e)), and a fourth one for forming the undoped AlGaAs window layer 7b (FIG. 14(f), FIG. 15(f)), thereby resulting in quite inferior workability in the fabrication process. In addition, because quite a difficult process is required to be performed for growing an undoped AlGaAs window layer 7b at the laser light emitting facet formed by cleavage, it is difficult to increase production yield and the process cannot be used in mass-production.

In the other prior art fabrication method shown in FIGS. 18, FIGS. 19(a)–19(f), and FIGS. 20(a)–20(f), because the region other than the ridge formation region is etched deeper than the undoped AlGaAs active layer 3, the side surface parallel to the resonator length direction of the etched active layer 3 is exposed after the etching processing, resulting in deteriorated quality of constitutional material at the side surface of the active layer and unfavorable influence on the laser characteristics.

SUMMARY OF THE INVENTION

It is an object of the present invention to provide a fabrication method of a ridge type semiconductor laser that reduces the number of crystal growths performed in the fabrication process of the semiconductor laser and that can form a window layer at a laser emitting facet of the laser chip without deteriorating the crystal at the light emitting facet of the active layer.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, after forming a laminated layer structure including a double heterojunction comprising an active layer and an upper and a lower cladding layer on opposite sides of the active layer on a semiconductor wafer, insulating film apertures are formed at both sides of the ridge formation region of the laser element at a first to-be-processed region including the ridge formation region and having a large insulating film aperture ratio. An insulating film aperture is formed at a light emitting facet formation region of the laser element at a second to-be-processed region including the light emitting facet formation region and having a small insulating film aperture ratio, and, thereafter, the insulating film aperture portions of respective to-be-processed regions are etched by chemical reactive gas etching having an increased etching rate for a reduced insulating film aperture ratio. Therefore, the active layer is not exposed at the sides of the ridge, and therefore, the characteristics of the laser element are not deteriorated due to the quality deterioration of the semiconductor layer at the exposed portions.

According to a second aspect of the present invention, because the ridge portion and the laser facet portion are formed at the same time, and high resistivity semiconductor layers are buried at both sides of the ridge and the etched concave portions of the laser facet portion by crystal growth after the etching, current blocking layers and window layers are formed in a single crystal growth, and, therefore, the number of crystal growths is reduced.

According to a third aspect of the present invention, because the insulating film aperture portion of the second to-be-processed region is selectively etched to make the side surfaces of the etched portions of the laser facets concave and high resistivity semiconductor layers are buried in the etched concave portions to form window layers at the laser facets, a difficult process of growing window layers at the laser facets which are formed by cleavage of a semiconductor wafer is not required. Therefore, a ridge type semiconductor laser having a window layer is easily produced.

According to a fourth aspect of the present invention, because the chip separation along the direction perpendicular to the resonator length direction of the laser element is performed by cleaving, a plane of a preferable mirror surface is simply obtained as a laser facet.

According to a fifth aspect of the present invention, because an etch stopping layer is formed in forming the upper cladding layer and chemically reactive gas etching employing the insulating film as a mask is performed with the etching stopped at the etch stopping layer in the first to-be-processed region and the etching proceeding to below the etch stopping layer in the second to-be-processed region, the active layer is surely not exposed to the sides of the ridge, whereby a semiconductor laser chip having no characteristic deterioration due to quality deterioration of material forming the active layer and having uniform characteristics and a high reliability is obtained.

BRIEF DESCRIPTION OF THE DRAWINGS

FIGS. 3(a)–3(f) are diagrams illustrating structures in cross-sections perpendicular to the resonator length direction of the semiconductor laser (cross-sections along line III—III of FIG. 1) in major process steps of the fabrication method according to the first embodiment.

FIGS. 12(a)–12(f) are diagrams illustrating structures in cross-sections perpendicular to the resonator length direction of the semiconductor laser (cross-sections along line 12—12 of FIG. 10) in major process steps of the fabrication method according to the third embodiment.

DETAILED DESCRIPTION OF THE PREFERRED EMBODIMENTS

Embodiment 1

Figure 1:
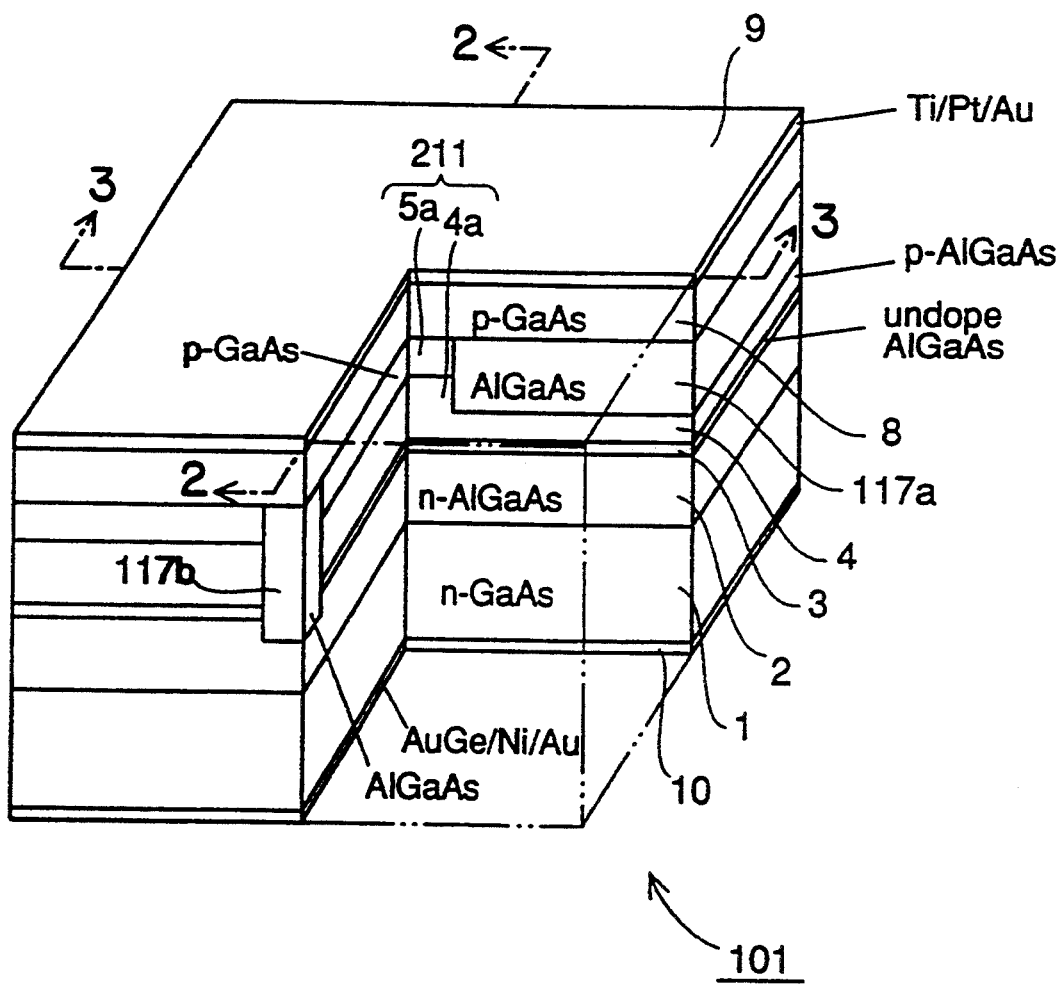
FIG. 1 is a perspective view, partly in cross-section, illustrating a structure of a ridge type semiconductor laser having a window layer fabricated by a fabrication method according to a first embodiment of the present invention.

FIG. 1 is a perspective view, partly in cross-section, illustrating a structure of a ridge type semiconductor laser having a window layer fabricated by a fabrication method according to a first embodiment of the present invention. FIGS. 2(a)–2(f) are diagrams illustrating structures in cross-section parallel to the resonator length direction of the semiconductor laser cross-sections along line 2—2 of FIG. 1) in major process steps of a fabrication method according to the first embodiment. FIGS. 3(a)–3(f) are diagrams illustrating structures in cross-sections perpendicular to the resonator length direction of the semiconductor laser (cross-sections along line 3—3 of FIG. 1) in major process steps of a fabrication method according to the first embodiment.

In the FIGS., reference numeral 101 designates a ridge type semiconductor laser chip having a window layer fabricated by a fabrication method according to the first embodiment. This laser chip 101 includes, as the laser chip 201 shown in FIG. 13 to FIGS. 15(a) to 15(f), an n type AlGaAs lower cladding layer 2, an undoped AlGaAs active layer 3, and a p type AlGaAs upper cladding layer 4 on an n type GaAs chip substrate 1. The upper cladding layer 4 includes a linear projecting portion 4a extending in the resonator length direction at a central portion thereof, and a linear projecting portion 4a and the p type GaAs cap layer 5a covering the upper surface thereof form a ridge 211 of the laser chip 101.

This embodiment includes high resistivity AlGaAs current blocking layers 117a on the upper cladding layer 4 at both sides of the ridge 211. A high resistivity AlGaAs window layer 117b is formed at a side surface of the light emitting facet of the ridge 211 reaching the lower cladding layer 2 below the active layer 3 from a surface of the cap layer 5a with the same width as that of the ridge 211. In the semiconductor laser chip 101 of this embodiment, portions of the lower cladding layer 2, the active layer 3, the upper cladding layer 4, and the cap layer 5 are exposed at both sides of the window layer 117b at the laser element facet.

A p type GaAs contact layer 8 is formed on the entire surface on the current blocking layers 117a and the ridge 211, a front surface electrode 9 comprising a Ti/Pt/Au laminated layer film is formed thereon, and a rear surface electrode 10 comprising an AuGe/Ni/Au laminated layer film is formed on the rear surface of the chip substrate 1.

The composition ratio x of the $Al_xGa_{1-x}As$ of the lower and upper cladding layers 2 and 4 is 0.48, the composition ratio of $Al_xGa_{1-x}As$ of the active layer 3 is 0.15, and the high resistivity current blocking layer 117a and the high resistivity window layer 117b comprise oxygen doped or undoped $Al_xGa_{1-x}As$ having composition ratio x=0.7.

Figure 4:
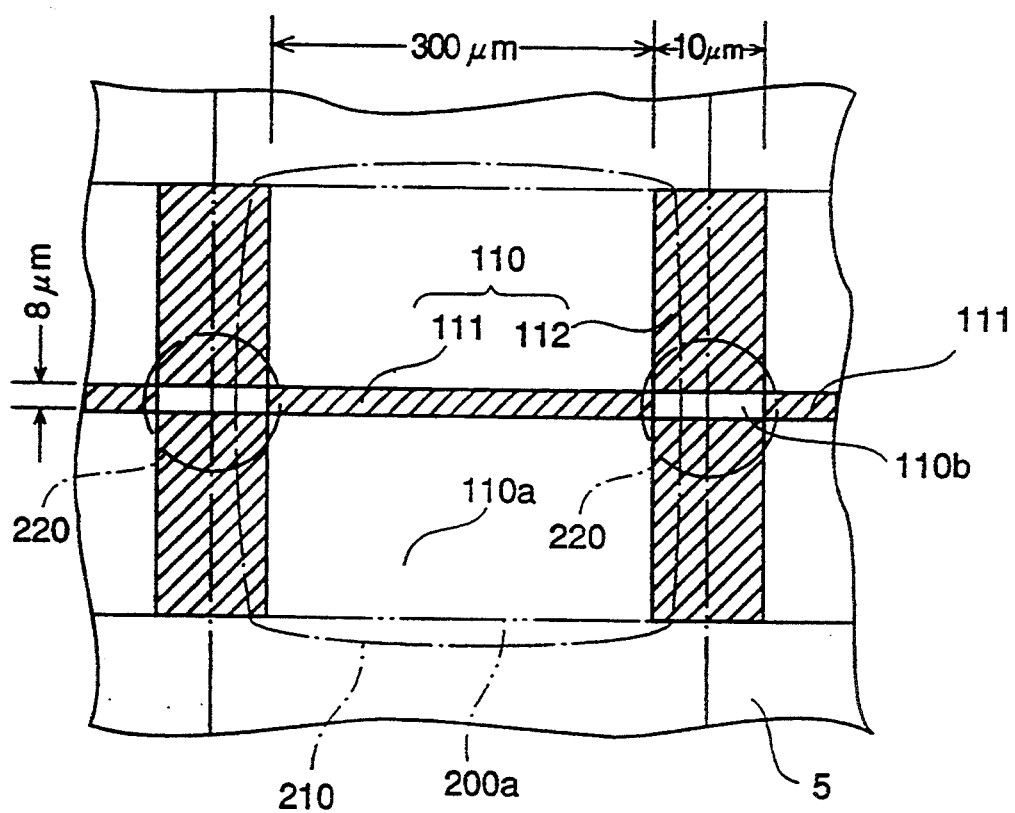
FIG. 4 is a diagram for explaining a plane pattern of an insulating film employed as a mask during the etching and the selective growth in the fabrication method according to the first embodiment.

FIG. 4 is a diagram for explaining a plan pattern of an insulating film that is employed as a mask during the etching and selective growth in the fabrication process according to the first embodiment. FIG. 4 shows a plan pattern of the insulating film as well as first and second to-be-processed regions having different insulating film aperture ratios, i.e., the area ratio of the insulating film aperture portion to the remaining insulating film and aperture portion.

In the FIG., reference numeral 200a designates respective chip regions which are assigned on the wafer 200. Reference numerals 210 and 220 designate a first to-be-processed region having a larger insulating film aperture ratio and a second to-be-processed region having a smaller insulating film aperture ratio which are formed corresponding to respective chip regions 200a, respectively. In the first to-be-processed region 210, a narrow SiN film 111 is formed only on the ridge formation region of the laser element, with insulating film apertures 110a at both sides of the ridge formation region. In the second to-be-processed region 220, insulating film apertures 110b are formed at extensions of the ridge formation region at the ends of each chip region 200a, and wide SiN films 112 extend at both edges of each chip region in a direction perpendicular to the SiN film 111. The SiN film 111 is 300 μm long and 8 μm wide. The short edge of the SiN film 111 corresponds to the light emitting facet of the laser element, and the distance between facets of the laser element at adjacent chip regions is set to about 10 μm. In the fabrication method of a semiconductor laser according to this embodiment, an etching method having a higher etching speed at the to-be-processed region having a small insulating film aperture ratio than the to-be-processed region having a large insulating film aperture ratio is employed. The principle of this etching method will be briefly described.

Figure 5:
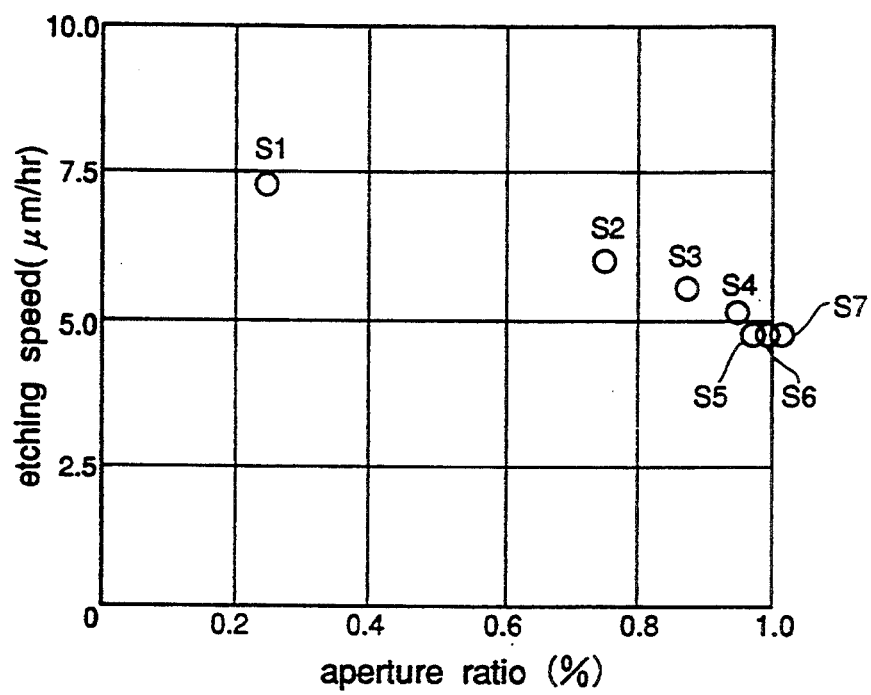
FIGS. 5(a) and 5(b) are diagrams for explaining the relation between the area ratio of the insulating film aperture to the insulating film remaining portion (insulating film aperture ratio) and etching speed.
Figure 5:
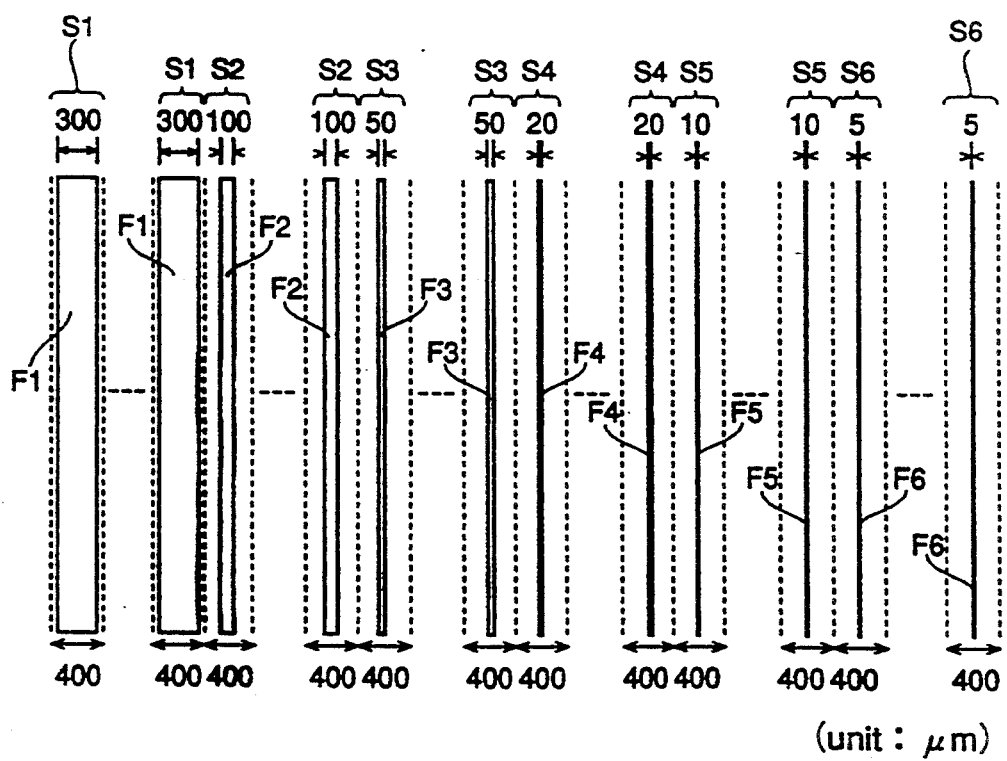

FIG. 5(a) shows the relationship between the insulating film aperture ratio and the etching speed when etching, employing HCl gas, seven sample regions having prescribed insulating film aperture ratios produced on the GaAs substrate by means of round marks for respective sample regions, and FIG. 5(b) shows patterns of the insulating film at the sample regions.

In the figures, reference characters S1 and S6 respectively designate narrow sample regions each 400 μm wide with a stripe-shaped insulating film F1 300 μm wide and a stripe-shaped insulating film F6 5 μm wide at the centers of regions S1 and S6, respectively.

Reference characters S2~S6 respectivley designate sample regions 800 μm wide produced by disposing narrow regions 400 μm wide adjacent to each other in left and right directions. At each narrow region at the left side of respective sample regions S1~S5, stripe-shaped insulating films F1~F5 300 μm, 100 μm, 50 μm, 20 μm, and 10 μm wide, respectively, are disposed, and at each narrow region at the right side of respective sample regions S2~S6, stripe-shaped insulating films F2~F6 100 μm, 50 μm, 20 μm, 10 μm, and 5 μm wide, respectively, are disposed. The stripe-shaped insulating films F1~F7 comprise respectively SiN films.

From FIG. 5(a), it is found that the etching depth becomes larger as the insulating film aperture ratio becomes smaller. This is because, although the semiconductor layer exposed by the insulating film aperture is etched with a portion thereof reacting with HCl gas that is supplied to the aperture, the HCl gas supplied to the insulating films F1~F6 do not react with the insulating film but moves to the insulating film aperture by diffusion and the like. This moved HCl gas reacts with the semiconductor layer exposed in the aperture. More particularly, as the area ratio of the insulating film aperture becomes smaller, the concentration of HCl supplied to the insulating film aperture by the movement of HCl gas from the insulating films F1~F6 is higher, thereby making the etching faster. As a result, the etched depth per unit time becomes larger as the insulating film aperture ratio becomes smaller.

A description is given of the fabrication method of the second embodiment.

Figure 2A:
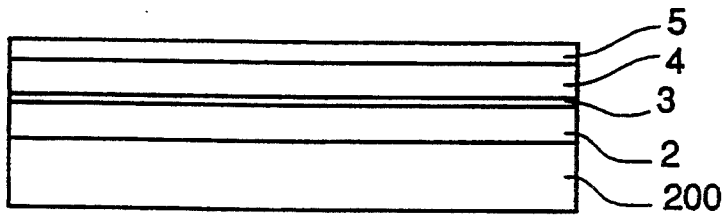
FIGS. 2(a)–2(f) are diagrams illustrating structures in cross-sections parallel with the resonator length direction of the semiconductor laser (cross-sections along line 2—2 of FIG. 1) in major process steps of the fabrication method according to the first embodiment.

First of all, on the n type GaAs wafer 200, an n type $Al_{0.48}Ga_{0.52}As$ lower cladding layer 2 1.5 μm thick, an undoped $Al_{0.15}Ga_{0.85}As$ active layer 3 0.03 μm thick, a p type $Al_{0.48}Ga_{0.52}As$ upper cladding layer 4 1.5 μm thick, and a p type GaAs cap layer 5 0.5 μm thick, are successively formed by crystal growth such as MOCVD or the like (FIG. 2(a), FIG. 3(a)).

Figure 2B:
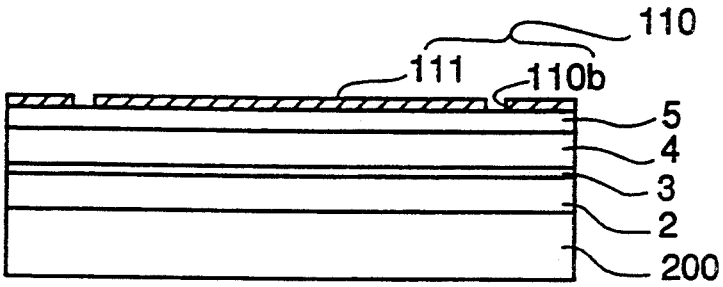

A SiN film is deposited on the cap layer 5 about 0.1 μm thick by thermal CVD or the like, thereafter the SiN film is patterned by photolithography and etching so as to leave a narrow film 111 corresponding to the ridge formation region and wide SiN films 112 corresponding to regions at both sides of the window layer, forming SiN mask films 110 serving as masks for etching and selective growth as shown in FIG. 4 (FIG. 2(b), FIG. 3(b)). Then, insulating film apertures 110a are formed at both sides of the ridge formation region, and insulating film apertures 110b are formed at chip end portions on an extension of the ridge formation region.

Figure 2C:
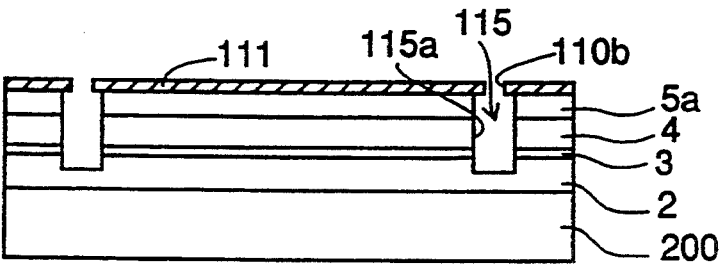

Employing the SiN film 110 as an etching mask, the insulating film aperture portions are etched by HCl gas etching in a reaction furnace of a reduced pressure ambient of about 50 Torr to form insulating film apertures (FIG. 2(c), FIG. 3(c)). The depth etched at the insulating film aperture is deeper where the insulating film aperture ratio is smaller. Accordingly, when the etching reaches to about 0.3 μm from the undoped active layer 3 at regions at both sides of the ridge, corresponding to insulating film apertures 110a in the first to-be-processed region 210 having a large insulating film aperture ratio, the etching reaches the lower cladding layer 4 below the undoped active layer 3 in the vicinity of the ridge facet in the insulating film aperture 110b in the second to-be-processed region 220 having a small insulating film aperture ratio, thereby forming the ridge 211 and the laser emitting facet 115a at the same time.

Figure 2D:
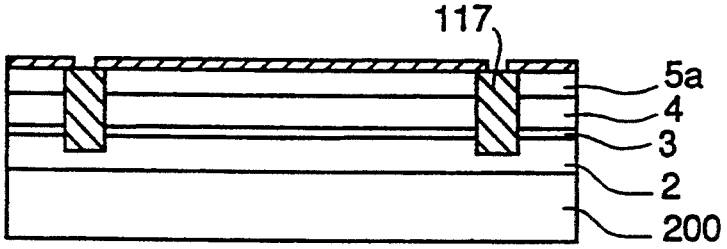

Thereafter, employing the SiN film 110 as a selective growth mask, a high resistivity $Al_{0.7}Ga_{0.3}As$ layer 117 is grown on the n type lower cladding layer 2 at the laser facets and on the p type upper cladding layer 4 at both sides of the ridge which are exposed by etching, so as to bury the laser facets and the side surfaces of the ridge (FIG. 2(d), FIG. 3(d)). Thereby, high resistivity AlGaAs current blocking layers 117a are formed at the etched-and-removed portions 116 at both sides of the ridge and high resistivity AlGaAs window layers 117b are formed at the etched-and-removed portions 115 at the sides of the laser facet.

Figure 2E:
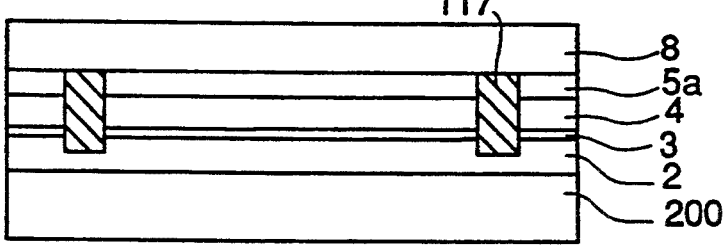
Figure 2F:
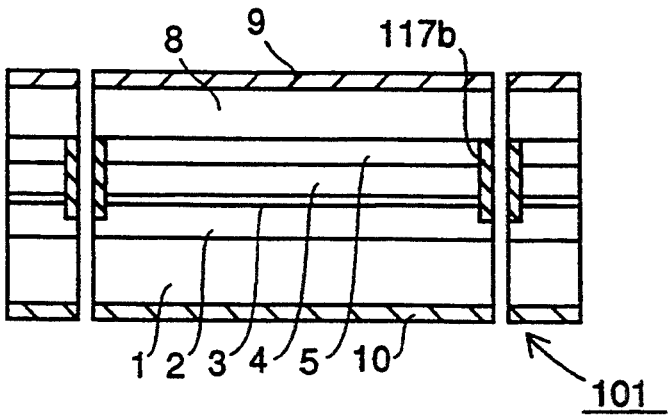
Figure 16A:
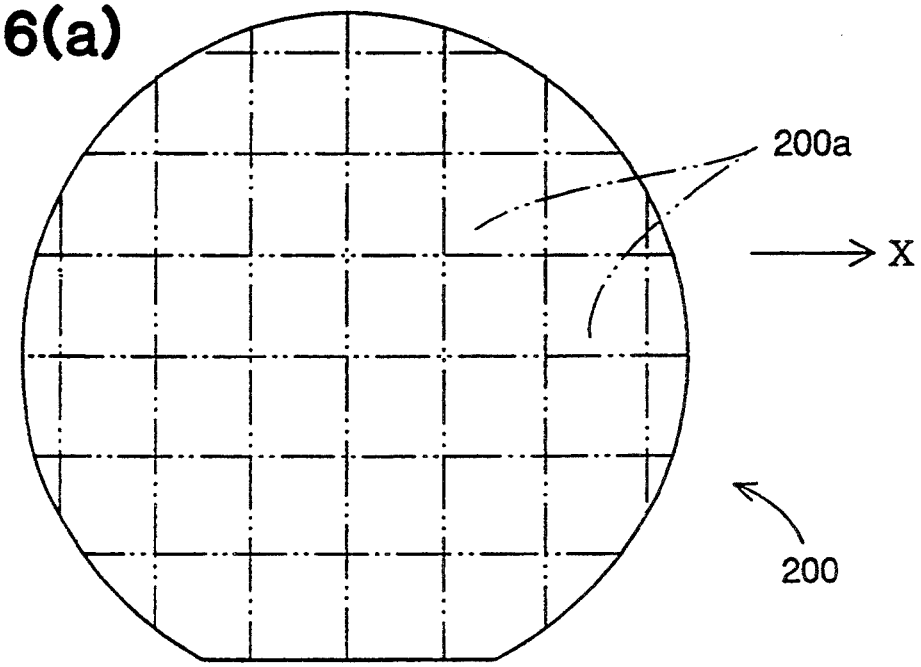
FIGS. 16(a) and 16(b) are diagrams illustrating the manner of cleaving the semiconductor laser fabricating laser elements in respective chip regions along the resonator length direction of the laser structure.
Figure 16B:
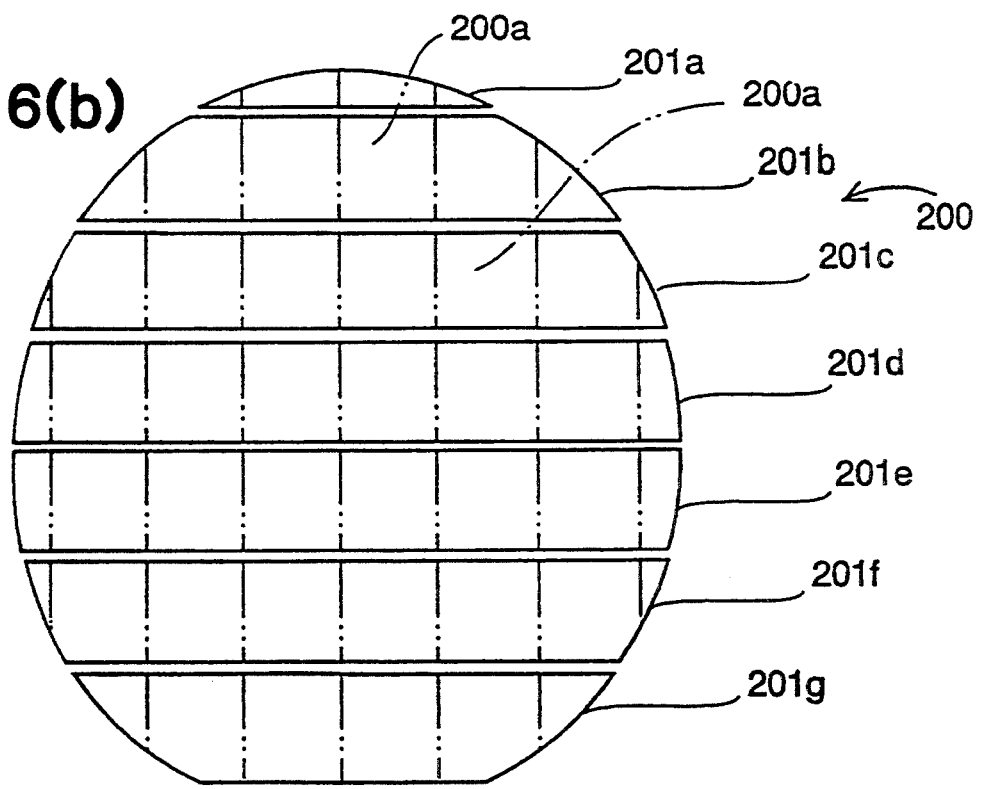
Figure 17A:
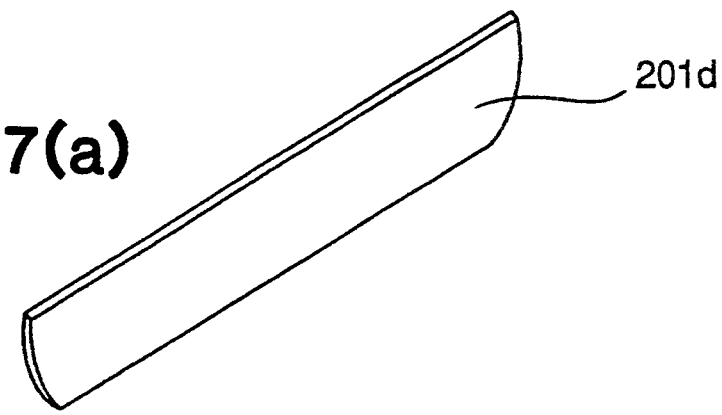
FIGS. 17(a)–17(c) are diagrams illustrating manner of separating wafer pieces obtained by cleavage into respective chips.
Figure 17B:
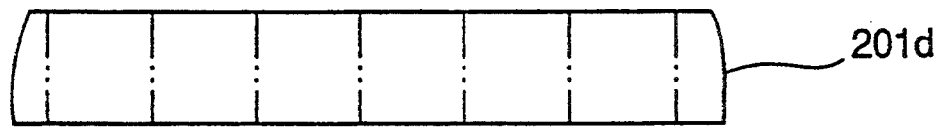
Figure 17C:
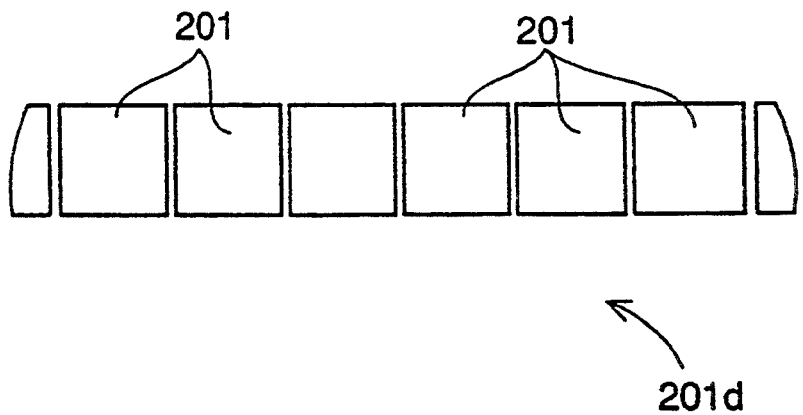
Figure 18:
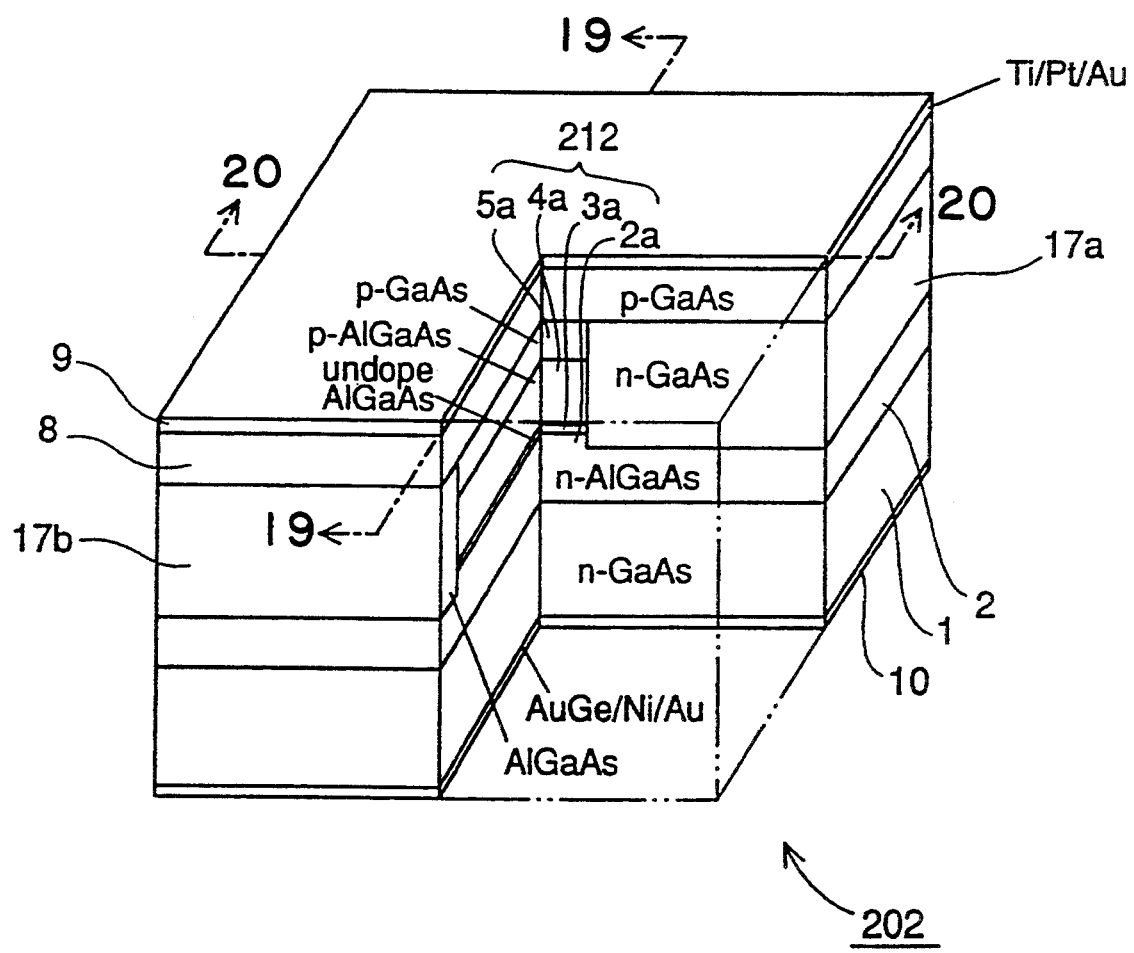
FIG. 18 is a perspective view, partly in cross-section illustrating a structure of a semiconductor laser fabricated by the another prior art fabrication method.
Figure 19A:
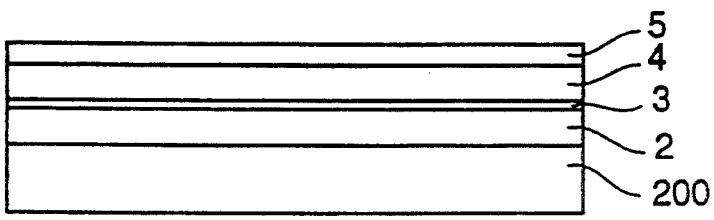
FIGS. 19(a)–19(f) are diagrams illustrating structures in cross-sections parallel to the resonator length direction of the semiconductor laser (cross-sections along line 19—19 of FIG. 18) in major process steps of the other prior art fabrication method.
Figure 19B:
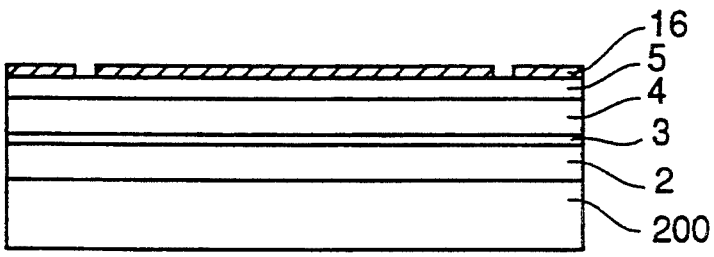
Figure 19C:
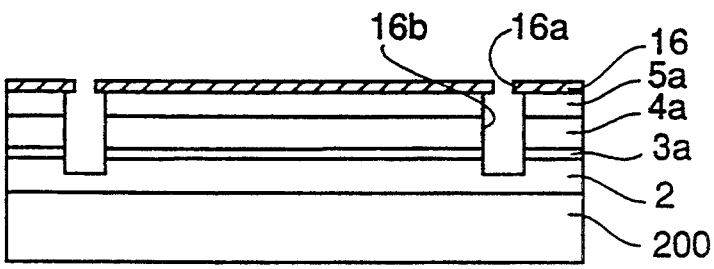
Figure 19D:
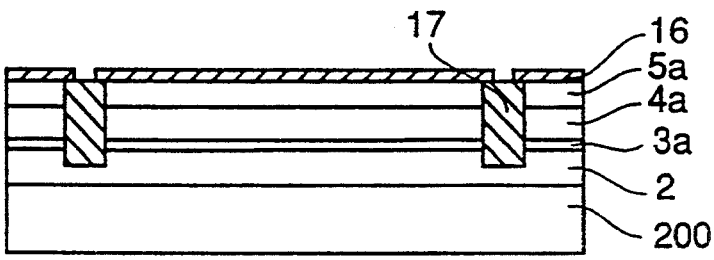
Figure 19E:
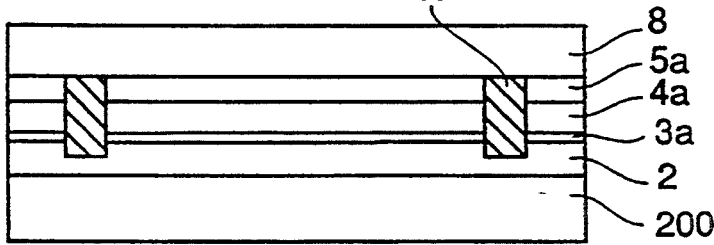
Figure 19F:
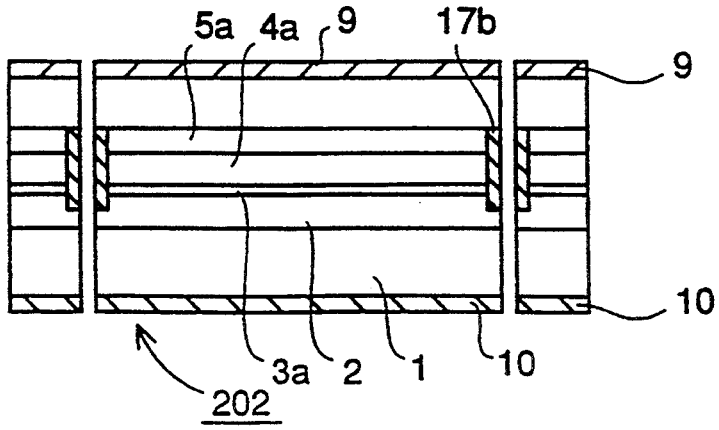
Figure 20A:
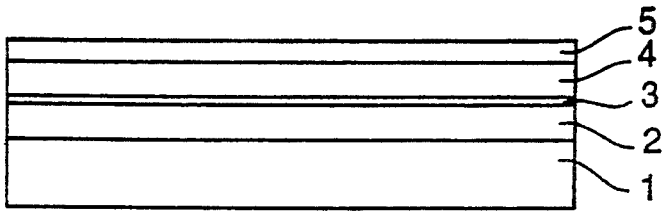
FIGS. 20(a)–20(f) are diagrams illustrating structures in cross-sections perpendicular to the resonator length direction of the semiconductor laser (cross-sections along line 20—20 of FIG. 18) in major process steps of the other prior art fabrication method.
Figure 20B:
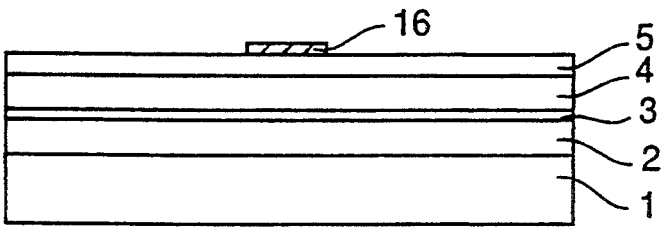
Figure 20C:
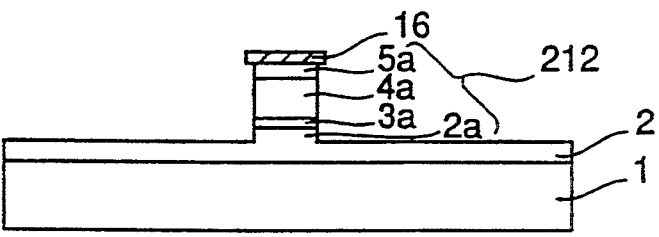
Figure 20D:
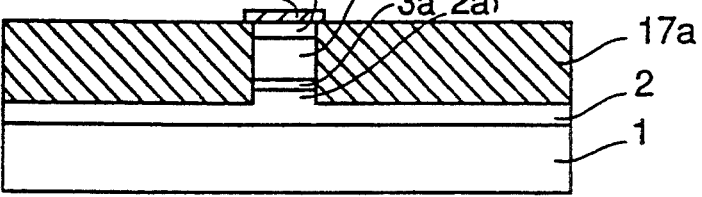
Figure 20E:
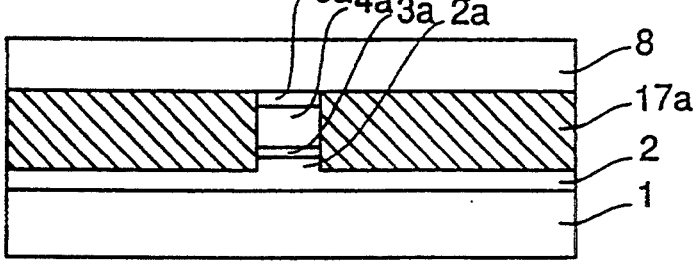
Figure 20F:
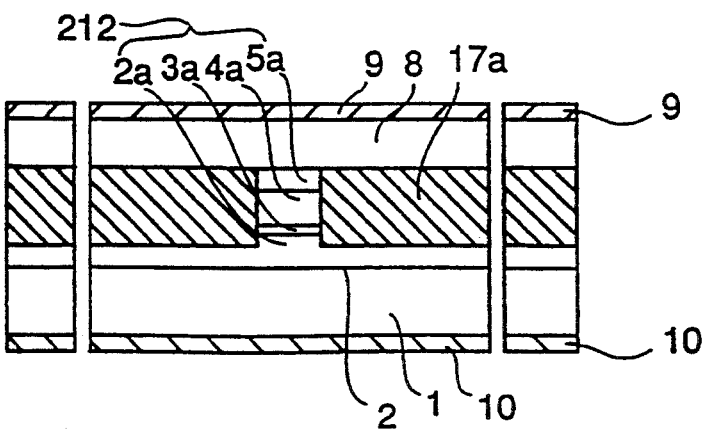

After the SiN film 110 is removed, a p type GaAs contact layer 8 is formed by crystal growth (FIG. 2(e), FIG. 3(e)), a Ti/Pt/Au front surface electrode 9 and an AuGe/Ni/Au rear surface electrode 10 are formed and, finally a semiconductor wafer 200 is cleaved along the direction x perpendicular to the resonator length direction of the laser element to form laser facets as shown in FIG. 16(a) and 16(b). Further, as shown in FIGS. 17(b) and 17(c), the laser elements formed on respective chip regions 200a of the wafer substrate 200 are separated by cleaving, dicing, or the like, to produce a ridge type semiconductor laser chips having a window layer 110 (FIG. 2(f), FIG. 3(f)).

In this first embodiment described above, after forming a laminated layer structure including a double heterojunction comprising the active layer 3 and the lower and the upper cladding layers 2 and 4 on opposite sides of the active layer 3 on a semiconductor wafer 1, insulating film apertures 110a are formed at both sides of the ridge formation region of the laser element at a first to-be-processed region 210 including the ridge formation region and having a large insulating film aperture ratio by patterning an insulating film at a region corresponding to respective chip region 200a and insulating film apertures 110b are formed at the light emitting facet formation region at a second to-be-processed region 220 including the light emitting facet formation region and having a small insulating film aperture ratio, by patterning insulating films at both sides regions of a region corresponding to respective chip region 200a. Thereafter, the insulating film apertures 110a and 110b of respective to-be-processed regions are etched by gas etching employing a reactive gas having an increased etching speed with a reduced insulating film aperture ratio. Therefore, even when the insulating film apertures 110b at both sides of the laser facet are etched deeper than the active layer 3, the etching is stopped in the upper cladding layer 4 on the active layer 3 in the insulating film aperture 110a at both sides of the ridge. Thus, the active layer 3 is not be exposed at the side surfaces of the ridge 211 and the characteristics of the semiconductor layer are not deteriorated due to quality deterioration at the exposed portion.

Furthermore, because the ridge portion 211 and the laser facet 115a are produced at the same time, high resistivity AlGaAs layers 117 are grown in the etched concave part 116 at both sides of the ridge as well as in the etched concave part 115 at the side of the laser facet at the same time, thereby forming the current blocking layer 117a and the window layer 117b on the same crystal growth, reducing the number of crystal growths.

Because the insulating film aperture 110b of the second to-be-processed region 220 is selectively etched to make the side surface of the etched concave part 115 a laser facet 115a, a high resistivity AlGaAs layer 117 is grown in the etched concave part 115 to form a window layer 117b at the laser facet, and a difficult process of growing a window layer on the laser facet that is formed by cleaving a semiconductor wafer can be dispensed with, thereby resulting in an easy fabrication of a ridge type semiconductor laser chip having a window layer 101.

In addition, because the separation along a direction perpendicular to the resonator length direction of the laser element is performed by cleaving during chip separation, a good mirror surface as a laser facet is easily obtained.

Embodiment 2

Figure 6:
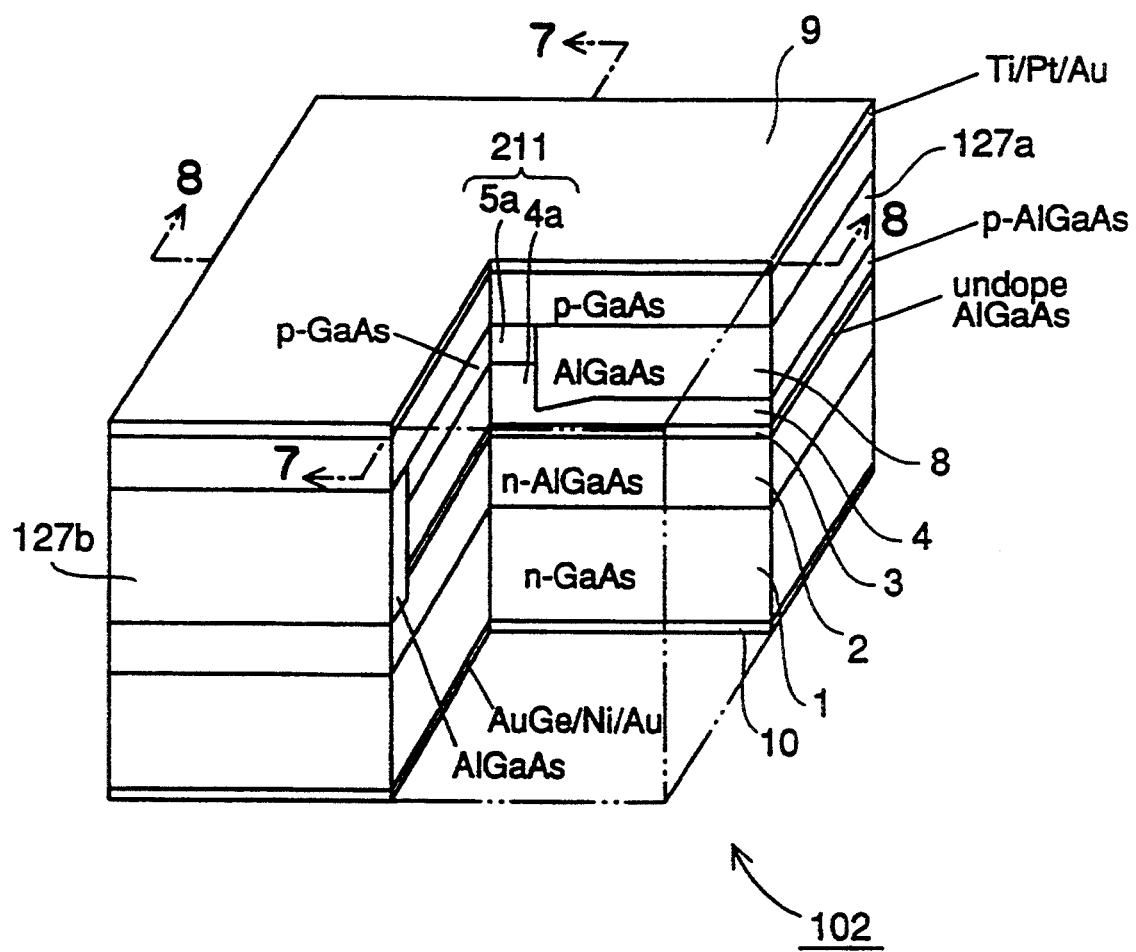
FIG. 6 is a perspective view partly in cross-section illustrating a structure of a ridge type semiconductor laser having a window layer fabricated by a fabrication method according to a second embodiment of the present invention.

FIG. 6 is a perspective view, partly in cross-section, illustrating a structure of a ridge type semiconductor laser having a window layer, fabricated by a fabrication method according to a second embodiment of the present invention. FIGS. 7(a)-7(f) are diagrams illustrating structures in cross-section parallel to the resonator length direction of the semiconductor laser (cross-sections along line 7—7 of FIG. 6) in major process steps of a fabrication method according to the second embodiment. FIGS. 8(a)-8(f) are diagrams illustrating structures in cross-section perpendicular to the resonator length direction of the semiconductor laser (cross-sections along line 8—8 of FIG. 6) in major process steps of a fabrication method according to the second embodiment.

In the FIGS., reference numeral 102 designates a ridge type semiconductor laser chip having a window layer fabricated according to the second embodiment. The laser chip 102 includes, as the semiconductor laser chip 102 of the first embodiment, a laminated layer structure comprising an n type AlGaAs lower cladding layer 2, an undoped AlGaAs active layer 3, and a p type AlGaAs upper cladding layer 4 formed on an n type GaAs chip substrate 1, and the upper cladding layer 4 includes a linear projecting portion 4a extending in the resonator length direction at its central portion. The linear projecting portion 4a and the p type GaAs cap layer 5a that cover an upper surface of the linear projecting portion 4a form a ridge 211 of the laser chip 102.

A high resistivity AlGaAs current blocking layer 127a is formed on the upper cladding layer 4 at both sides of the ridge 211 as in the first embodiment. The current blocking layer 127a of this second embodiment has a larger depth than the other portion in the vicinity of the ridge 211. Further, in this second embodiment, a high resistivity AlGaAs window layer 127b has a depth reaching the lower cladding layer 4 below the active layer 3 from the surface of the cap layer 5a and has the same width as the laser chip.

The other constructions, i.e., the constitutional material of the front surface electrode 9 and the rear surface electrode 10, and composition ratio of $Al_xGa_{1-x}As$ of the lower cladding layer 2, the active layer 3, the upper cladding layer 4, the high resistivity current blocking layer 127a, and the high resistivity window layer 127b, are the same as those of the first embodiment.

Figure 9:
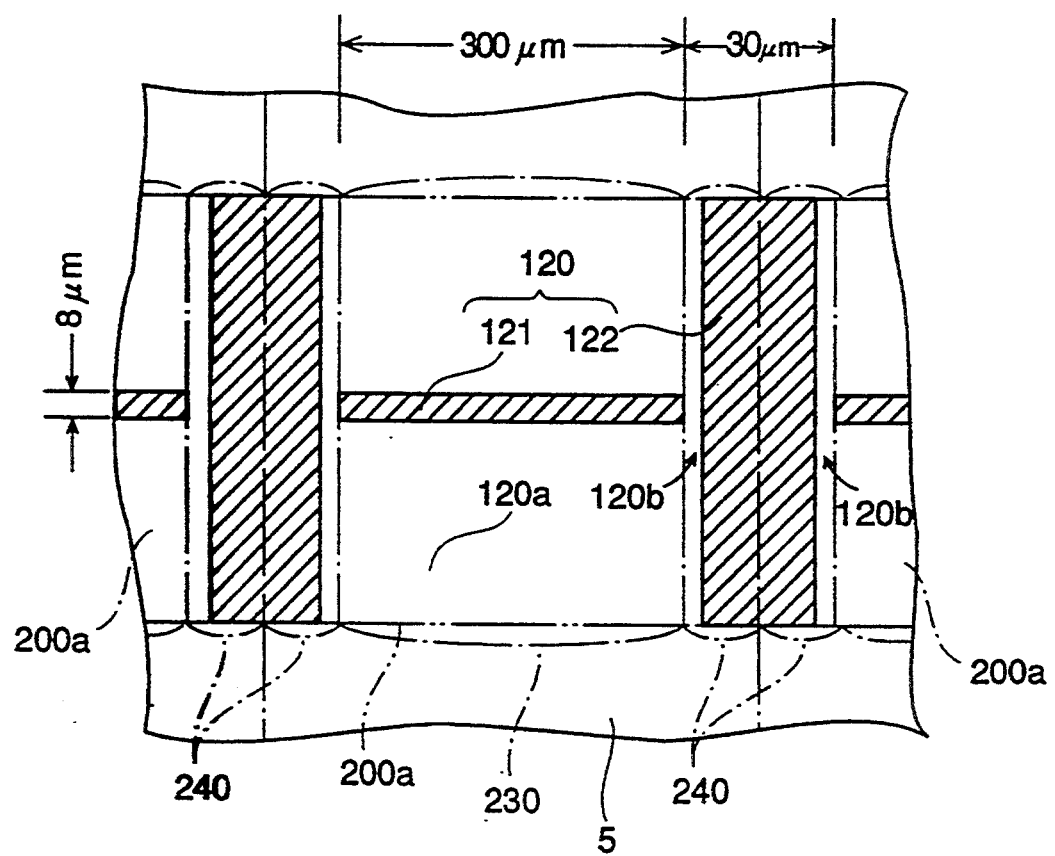
FIG. 9 is a diagram for explaining a plane pattern of an insulating film employed as a mask during the etching and selective growth in the fabrication method according to the second embodiment.

FIG. 9 is a diagram illustrating a plan view of the insulating film employed as a mask during the etching and selective growth in the fabrication process according to this embodiment. In FIG. 9, first and a second to-be-processed regions having different insulating film aperture ratios, i.e., area ratios of the insulating film apertures to the insulating film remaining and aperture portions as well as the plan pattern of the insulating film are illustrated.

In the figure, reference numeral 200a designates respective chip regions assigned on the wafer 200. Reference numerals 230 and 240 designate respectively a first to-be-processed region having a large insulating film aperture ratio and second to-be-processed regions having a small insulating film aperture ratio, both formed corresponding to respective chip regions 200a. The second to-be-processed regions 240 include window layer forming regions at both ends of the chip region 200a and the first to-be-processed region 230 is positioned between the second to-be-processed regions 240.

In the first to-be-processed region 230, a narrow SiN film 121 is formed only on the ridge formation region of the laser element, and both sides are formed as insulating film apertures 120a. The distance between the narrow SiN films 121 confronting to each other between adjacent chip regions is about 30 μm.

On the adjacent second to-be-processed regions 240 of the adjacent chip regions, stripe-shaped SiN films 122 having a large width in the direction perpendicular to the direction of the narrow SiN film 121 is formed so as to produce an interval of about 0.01 μm between itself and the confronting narrow SiN films 121, and a larger portion of the region 240 is covered by the wide stripe-shaped SiN film 122. In this embodiment, the narrow SiN film 121 is 300 μm long 8 μm wide, a short edge of the narrow SiN film 121 corresponds to the light emitting facet of the semiconductor laser chip, and the distance between the light emitting facets of the laser chips produced by adjacent chip regions is about 30 μm, approximately in coincidence with the distance between the confronting narrow SiN films 121.

A description is given of the fabrication method.

Figure 7A:
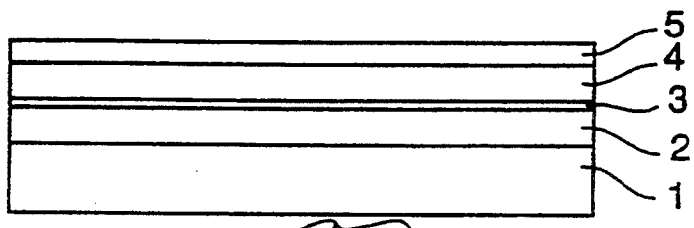
FIGS. 7(a)–7(f) are diagrams illustrating structures in cross-sections parallel to the resonator length direction of the semiconductor laser (cross-sections along line 7—7 of FIG. 6) in major process steps of the fabrication method according to the second embodiment.
Figure 8A:
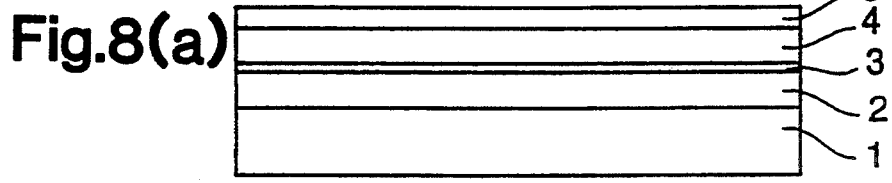
FIGS. 8(a)–8(f) are diagrams illustrating structures in cross-sections perpendicular to the resonator length direction of the semiconductor laser (cross-sections along line 8—8 of FIG. 6) in major process steps of the fabrication method according to the second embodiment.

First of all, as similarly in the first embodiment, on an n type GaAs substrate 1, an n type $Al_{0.48}Ga_{0.52}As$ lower cladding layer 2 1.5 μm thick, an undoped $Al_{0.15}Ga_{0.85}As$ active layer 3 0.03 μm thick, a p type $Al_{0.48}Ga_{0.52}As$ upper cladding layer 4 1.5 μm thick, and a p type GaAs cap layer 5 0.5 μm thick are successively formed by MOCVD or the like (FIG. 7(a), FIG. 8(a)).

Figure 7B:
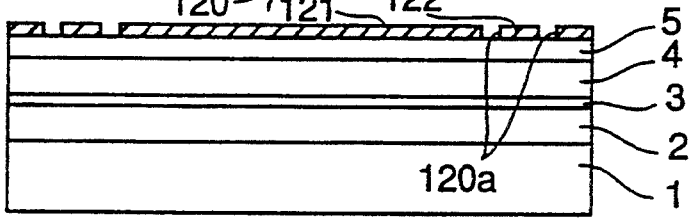
Figure 7C:
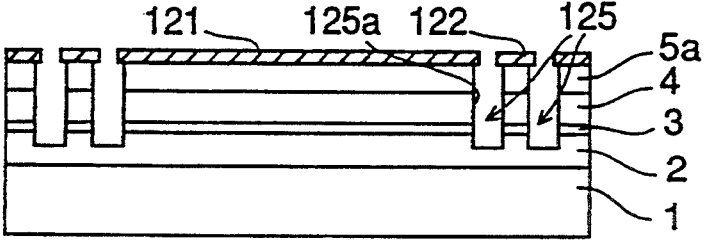
Figure 8B:
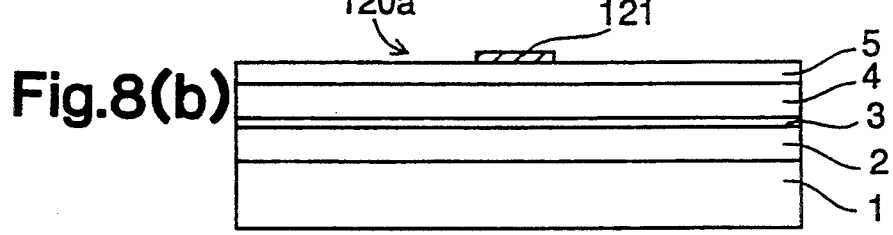
Figure 8C:
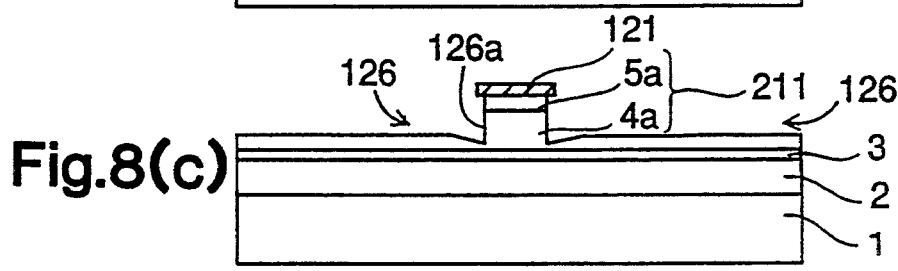

A SiN film is deposited by thermal CVD or the like, thereafter, the SiN film is patterned by photolithography and etching so that a narrow SiN film 121 remains on the ridge forming region and wide stripe-shaped SiN films 122 remain at both sides of the chip region as shown in FIG. 9, resulting a mask SiN film 120 serving as a mask for etching and selective growth (FIG. 7(b), FIG. 8(b)). Then, at both sides of the narrow SiN film 121 insulating film apertures 120a are formed, and insulating film apertures 120b are formed between the narrow SiN film 121 and the wide stripe-shaped SiN films 122 parallel to the direction perpendicular to the direction of the fine slender SiN film 121.

Thereafter, employing the SiN film 120 as an etching mask, the insulating film aperture portions are etched by HCl gas etching in a reaction furnace at about 200 Torr which deeply etches in the vicinity of the SiN film 120 in the insulating film aperture portions 120a and 120b. Then, the etching depths in the vicinity of the SiN film 120 in the insulating film aperture portions are different depending on the insulating film aperture ratios. Where this ratio is smaller, the etching depth is larger. This is explained as in the following.

The HCl gas supplied to the insulating film aperture portions react with the semiconductor layer that is exposed in the aperture and etched. Then, the HCl gas supplied to the insulating film 120 does not react with the insulating film, and moves to the insulating film apertures by diffusion or the like to react with the semiconductor layer exposed in the insulating film apertures. Because the pressure in the furnace is a little high, about 200 Torr, the moving distance due to diffusion or the like of HCl gas supplied to the insulating film 120 is shortened to partially increase the concentration of the HCl gas supplied to the vicinity of the insulating film in the insulating film aperture, thereby performing etching that is partially deeper in the vicinity of the insulating film in the insulating film aperture. In addition, as the area ratio of the insulating film occupying the region including the insulating film aperture increases, the concentration of HCl gas at the aperture portion increases with the HCl gas moving to the aperture portion from on the insulating film, thereby performing selective etching which is deeper at the insulating film aperture.

Accordingly, when etching to about 0.3 μm on the undoped active layer 3 at the side of the ridge in the first to-be-processed region 230 having a large insulating film aperture ratio, the etching reaches to the n type lower cladding layer 4 below the undoped active layer 3 in the vicinity of the ridge facet in the second to-be-processed region 240 having a small insulating film aperture ratio, thereby forming a laser facet 125a as well as the ridge 211 at the same time.

Figure 7D:
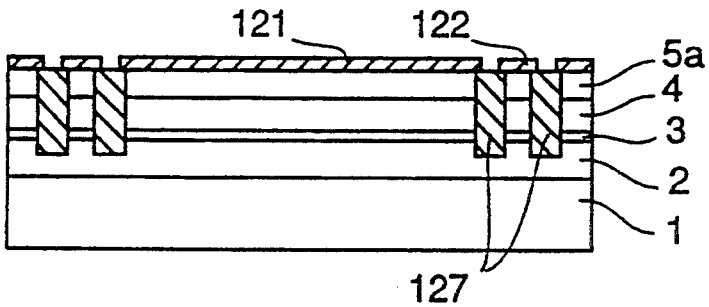
Figure 8D:
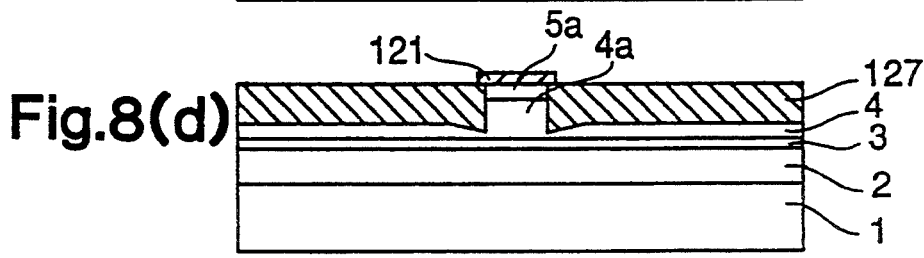

Thereafter, employing the SiN film 120 as a selective growth mask, a high resistivity $Al_{0.7}Ga_{0.3}As$ layer 127 is grown on the n type lower cladding layer 2 at the sides of the laser facets exposed by the etching and on the p type upper cladding layer 4 at both sides of the ridge by MOCVD or the like to bury the laser facet and the sides of the ridge (FIG. 7(d), FIG. 8(d)). Thereby, high resistivity AlGaAs current blocking layers 127a are formed at both sides of the ridge and high resistivity AlGaAs window layers 127b are produced at the laser facets.

Figure 7E:
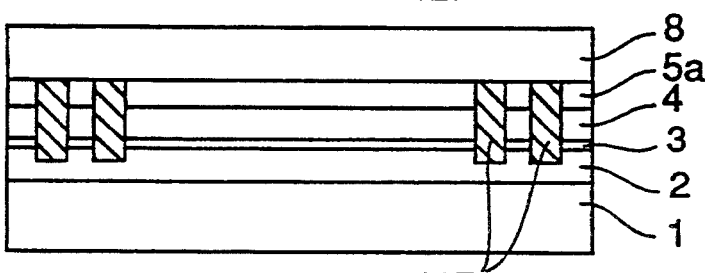
Figure 7F:
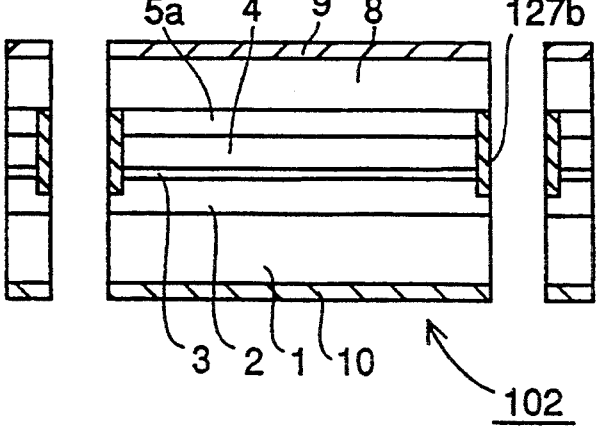
Figure 8E:
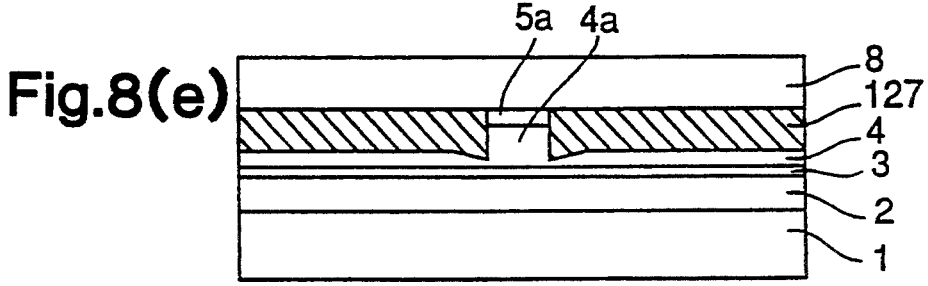
Figure 8F:
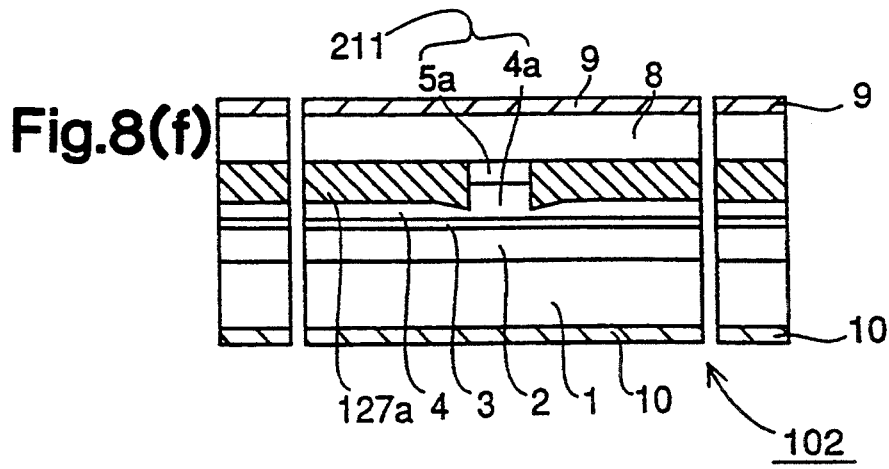

Then, after removing the SiN film 110, a p type GaAs contact layer 8 is grown (FIG. 7(e), FIG. 8(e)), and further a Ti/Pt/Au surface electrode 9, and an AuGe/Ni/Au rear surface electrode 10 are formed. Finally, the semiconductor wafer is cleaved in the direction X perpendicular to the resonator length direction of the laser element to form laser facets (FIG. 16(a), 16(b)), and respective chip regions of the wafer are cut separated by cleaving or dicing (FIG. 17(b) 17(c)), producing ridge type semiconductor laser chips having a window layer 102 (FIG. 7(f), FIG. 8(f)).

In this second embodiment described above, after a laminated layer structure including a double heterojunction comprising the active layer 3 and lower and upper cladding layers 2 and 4 on opposite sides of the active layer 3, is formed on the semiconductor wafer 1, a first to-be-processed region 230 having a large insulating film aperture ratio and having only a narrow SiN film 121 on the ridge formation region of the laser element and a second to-be-processed region 240 having a small insulating film aperture ratio and having a wide stripe-shaped SiN film 122 in the direction perpendicular to the SiN film 121 between two SiN films 121 are formed by patterning an insulating film. Then, the insulating film aperture is etched by gas etching and has a larger etching speed as the insulating film aperture ratio becomes smaller and the etched portion is closer to the periphery of the insulating film. Therefore, even when the insulating film aperture portion 120b at the side of the laser facet is etched deeper, the etching is stopped in the upper cladding layer 4 on the active layer 3 in the insulating film aperture 120a at both sides of the ridge, whereby the active layer 3 is not exposed at sides of the ridge 211 and characteristic deterioration due to quality deterioration of a semiconductor layer at the exposed portion is prevented, as in the first embodiment.

Embodiment 3

Figure 10:
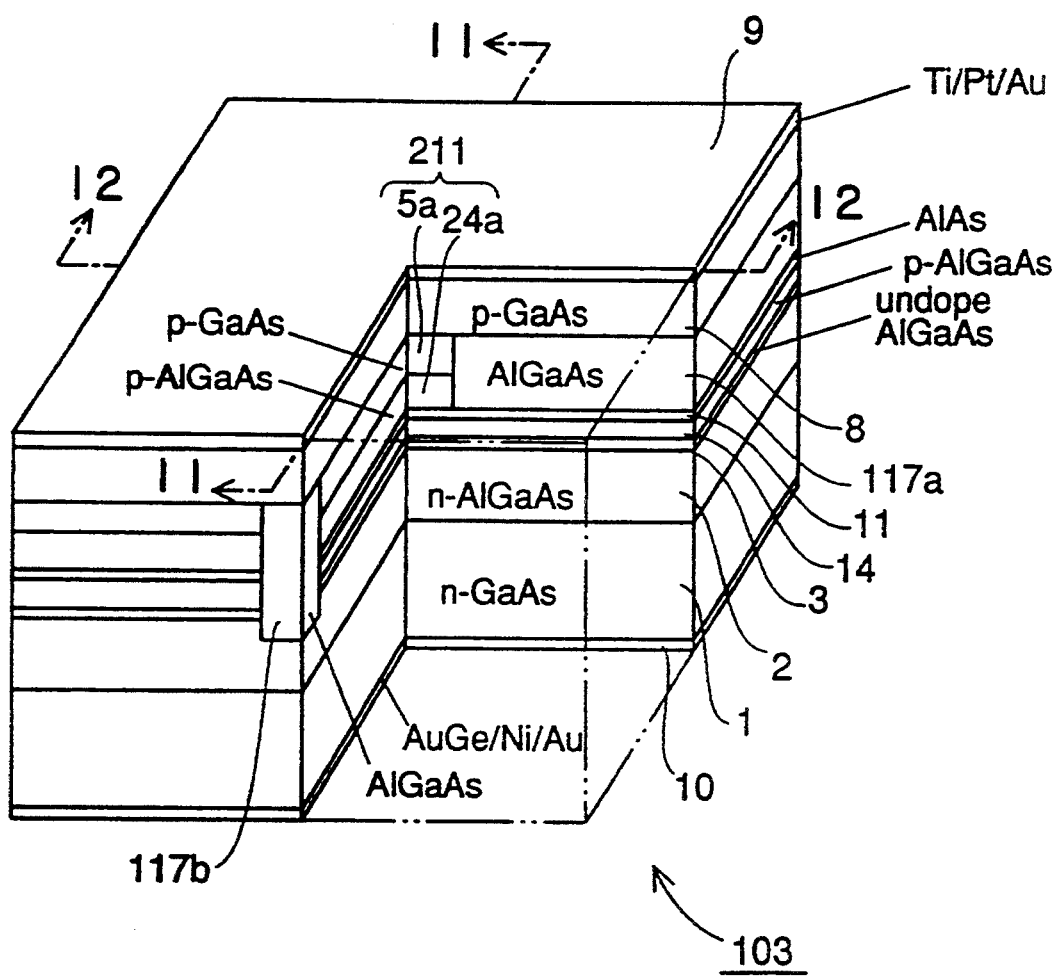
FIG. 10 is a perspective view partly in cross-section illustrating a structure of a ridge type semiconductor laser having a window layer fabricated by a fabrication method according to a third embodiment of the present invention.

FIG. 10 is a perspective view in partly in cross-section illustrating a structure of a ridge type semiconductor laser having a window layer fabricated by a fabrication method according to a third embodiment of the present invention. FIGS. 11(a)–11(f) are diagrams illustrating structures in cross-section parallel to the resonator length direction of the semiconductor laser (cross-sections along line 11—11 of FIG. 10) in major process steps of a fabrication method according to the third embodiment. FIGS. 12(a)–12(f) are diagrams illustrating structures in cross-section perpendicular to the resonator length direction of the semiconductor laser (cross-sections along line 12—12 of FIG. 10) in major process steps of a fabrication method according to the third embodiment.

In the figures, reference numeral 103 designates a ridge type semiconductor laser chip having a window layer manufactured according to the third embodiment. The laser chip 103 includes a p type AlAs etch stopping layer 11 having an etching speed of about 1/5 of the etching speed by HCl gas etching as compared with upper cladding layer 4 This etch stopping layer 11 is located at a position about 0.3 μm above the undoped $Al_{0.15}Ga_{0.85}As$ active layer 3 in the p type upper cladding layer 4. Reference numeral 14 designates a lower portion of the upper cladding layer about 0.3 μm thick positioned at a lower side from the upper cladding layer 4 relative to the etch stopping layer 11 and reference numeral 24a designates an upper portion of the upper cladding layer about 1.2 μm thick positioned at an upper side from the upper cladding layer 4 relative to the etch stopping layer 11. The upper portion of the upper cladding layer 24a and the cap layer 5a formed thereon constitute the ridge 211.

A description is given of the fabrication method.

First of all, after an n type $Al_{0.48}Ga_{0.52}As$ lower cladding layer 2 1.5 μm thick and an undoped $Al_{0.15}Ga_{0.85}As$ active layer 3 0.03 μm thick are grown on an n type GaAs wafer 200, a p type $Al_{0.48}Ga_{0.52}As$ layer serving as a lower portion of the upper cladding layer 14 is grown to about 0.3 μm thick, and subsequently a p type AlAs etch stopping layer 11 is grown to be 0.02 μm thick and have an impurity (Zn) concentration of about $1 \times 10^{18}$ cm$^{-3}$, a p type $Al_{0.48}Ga_{0.52}As$ layer serving as an upper cladding layer upper portion 24 is grown thereon to about 1.2 μm thick, and a p type GaAs cap layer 5 about 0.5 μm thick is grown thereon (FIG. 11(a) and FIG. 12(a)). The formation of respective semiconductor layers is carried out by MOCVD or the like.

Figure 11A:
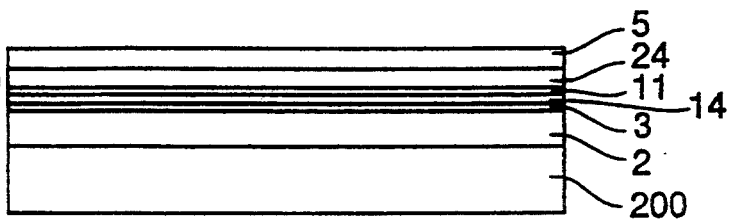
FIGS. 11(a)–11(f) are diagrams illustrating structures in cross-sections parallel to the resonator length direction of the semiconductor laser (cross-sections along line 11—11 of FIG. 10) in major process steps of the fabrication method according to the third embodiment.
Figure 11B:
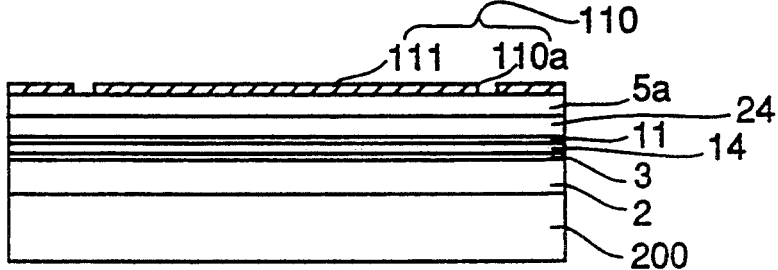

Thereafter, a SiN film 110 serving as an etching mask and a selective growth mask is formed by deposition of SiN and its patterning (FIG. 11(b) and FIG. 12(b)). Then, as in the first embodiment, for respective chip regions, a narrow SiN film 111 corresponding to the ridge formation region and wide SiN films 112 corresponding to regions at both sides of the window layer are formed, insulating film apertures 110a are formed at both sides of the ridge formation region, and an insulating film aperture 110b is formed at the end of the chip on an extension of the ridge formation region.

Figure 11C:
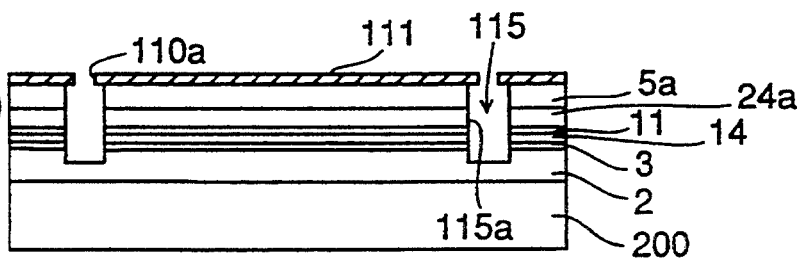

Employing the SiN film 110 as an etching mask, the insulating film aperture is etched by HCl gas etching, thereby forming the ridge 211 as well as the light emitting facets 115a of the ridge (FIG. 11(c) and FIG. 12(c)).

Then, since the etch stopping layer 11 has a small etching speed by HCl gas etching, about 1/5 of that of the upper cladding layer 4, the etching of the insulating film aperture in the vicinity of the laser facet is not stopped by the p type etch stopping layer 11, leaving the upper cladding layer 4 at both sides of the ridge with a prescribed film thickness with high controllability.

Figure 11D:
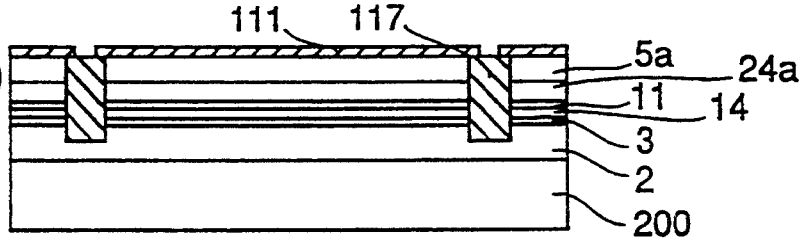
Figure 11E:
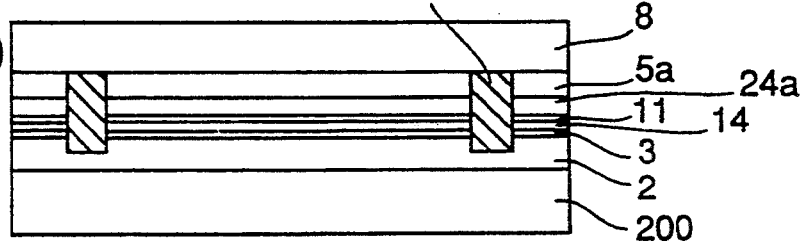

Employing the SiN film 110 as a selective growth mask, a high resistivity $Al_{0.7}Ga_{0.3}As$ layer 117 is grown to bury the etched portion 116 at both sides of the ridge and the etched concave portion 115a at the sides of the light emitting facets of the ridge with high resistivity AlGaAs, thereby forming current blocking layers 117a at both sides of the ridge 211 and high resistivity AlGaAs window layers 117b at light emitting facets of the ridge (FIG. 11(d) and FIG. 12(d)).

Figure 11F:
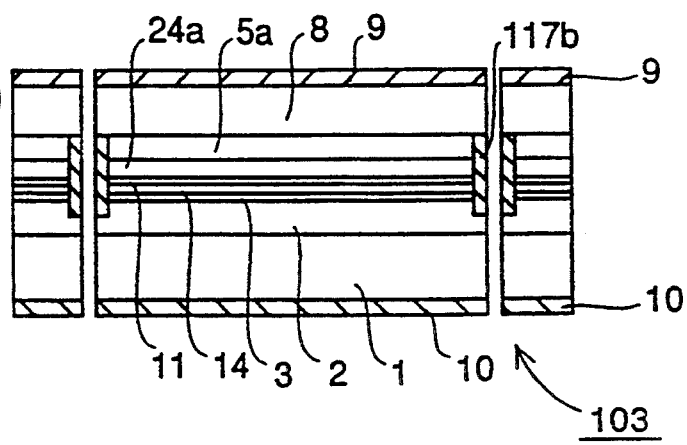
Figure 13:
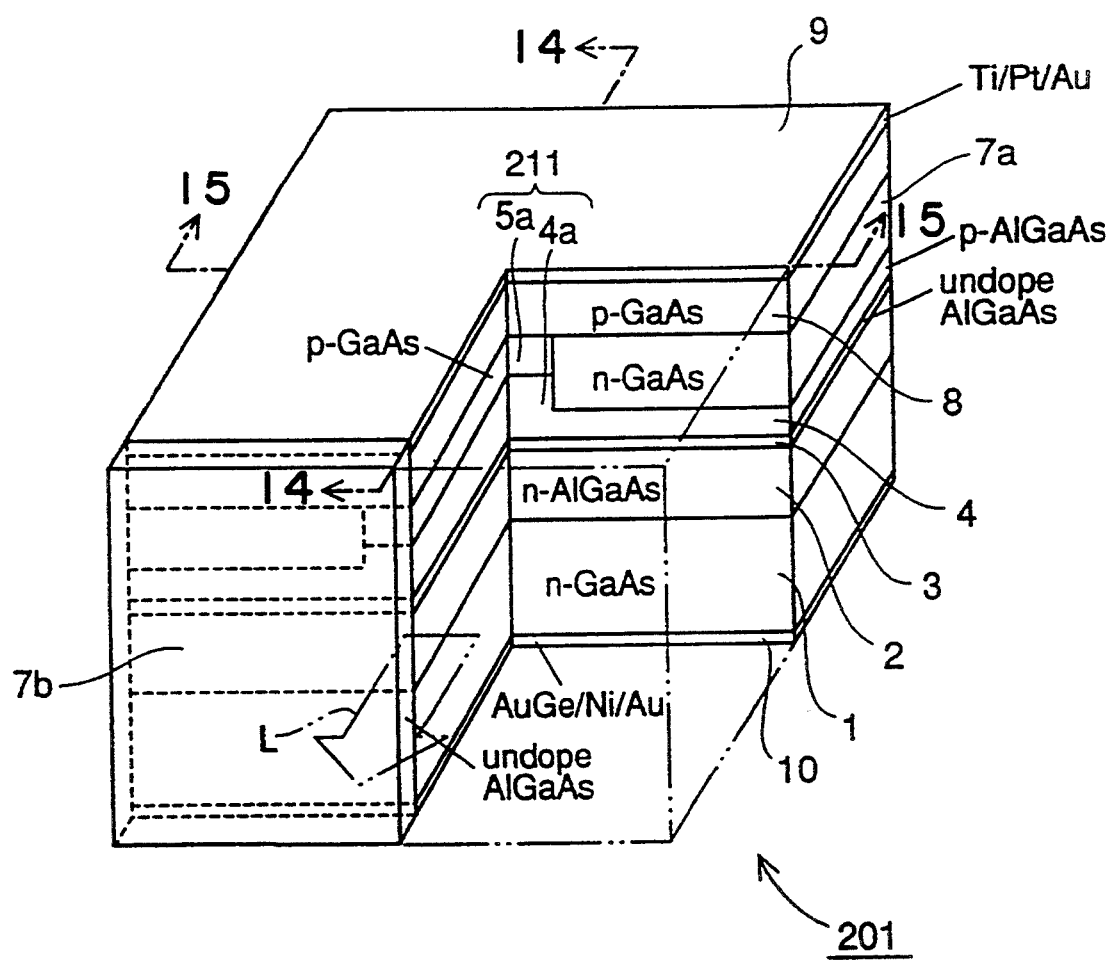
FIG. 13 is a perspective view partly in cross-section illustrating the structure of a prior art ridge type semiconductor laser having a window layer.
Figure 14A:
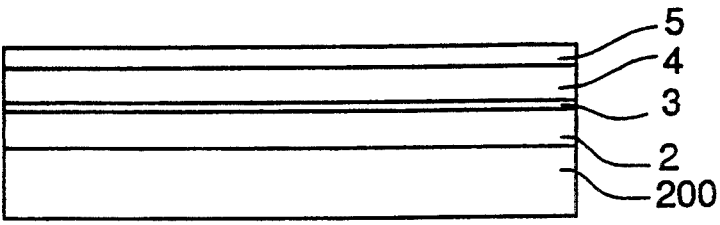
FIGS. 14(a)–14(f) are diagrams illustrating structures in cross-sections parallel to the resonator length direction of the semiconductor laser (cross-sections along line 14—14 of FIG. 13) in major process steps of a prior art fabrication method.
Figure 14B:
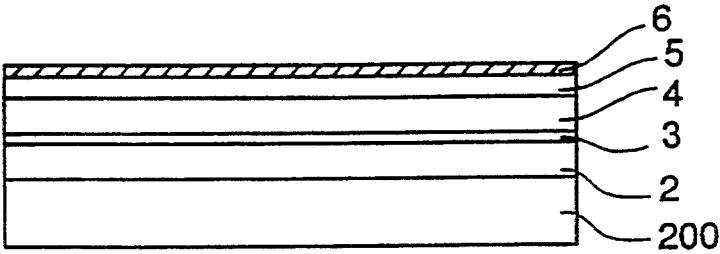
Figure 14C:
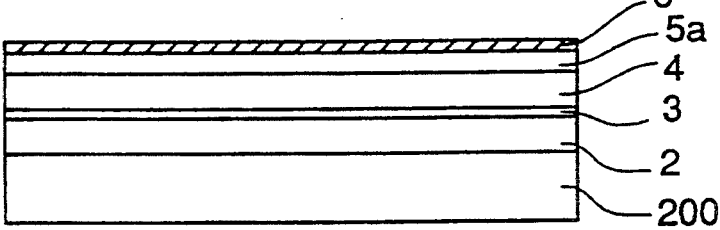
Figure 14D:
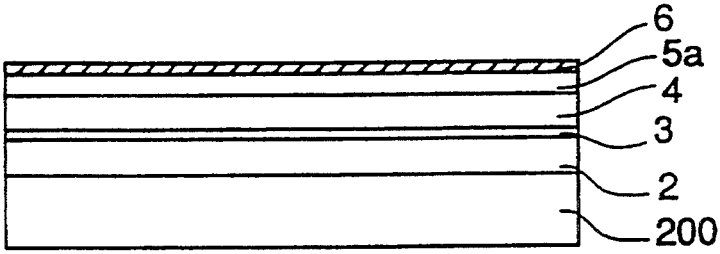
Figure 14E:
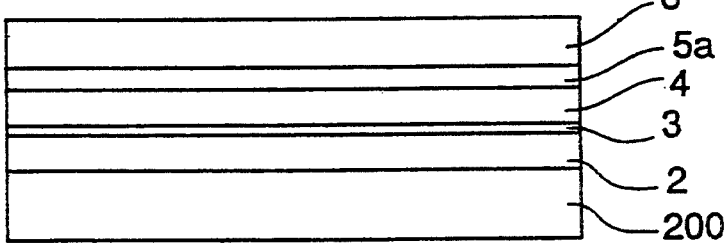
Figure 14F:
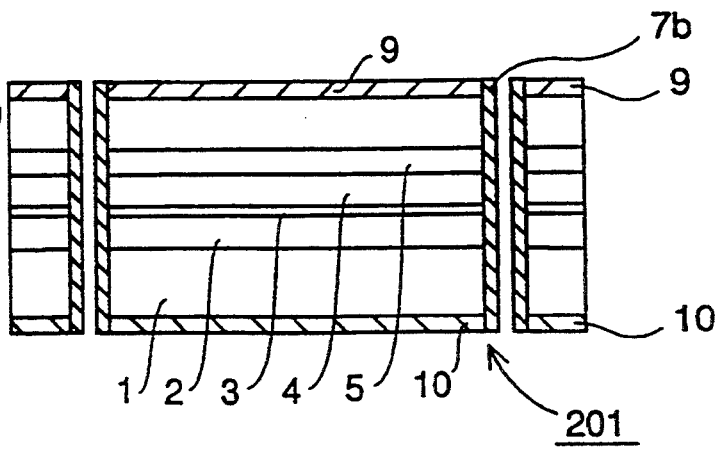
Figure 15A:
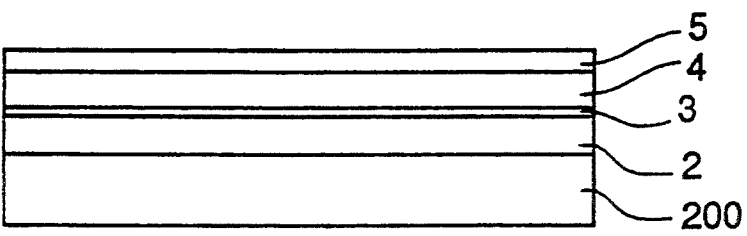
FIGS. 15(a)–15(f) are diagrams illustrating structures in cross-sections perpendicular to the resonator length direction of a semiconductor laser (cross-sections along line 15—15 of FIG. 13) in major process steps of the prior art fabrication method.
Figure 15B:
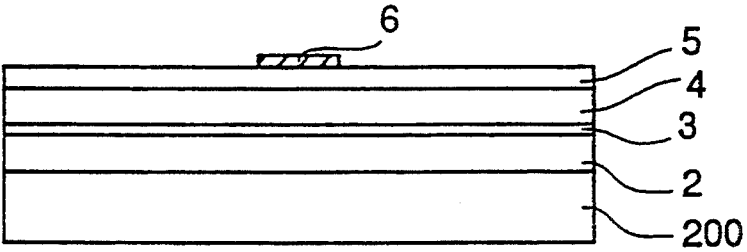
Figure 15C:
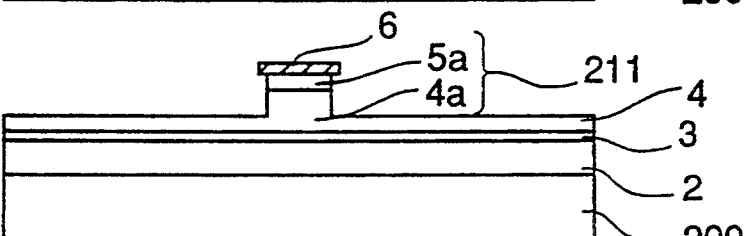
Figure 15D:
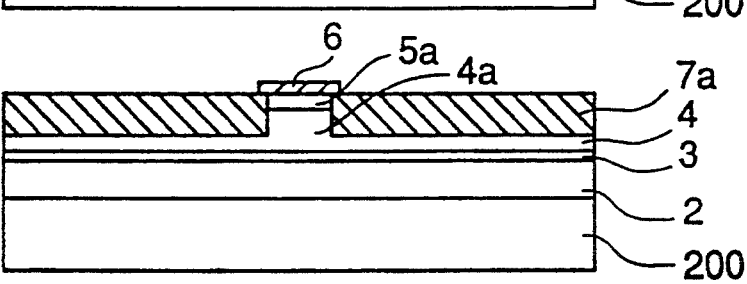
Figure 15E:
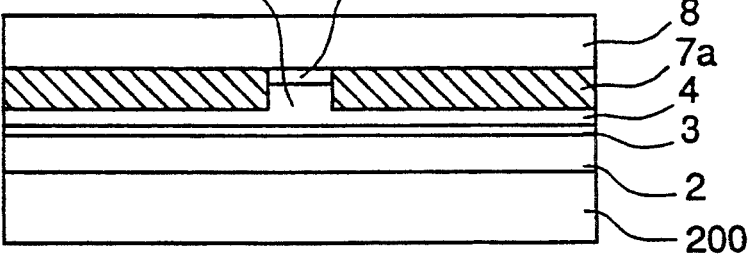
Figure 15F:
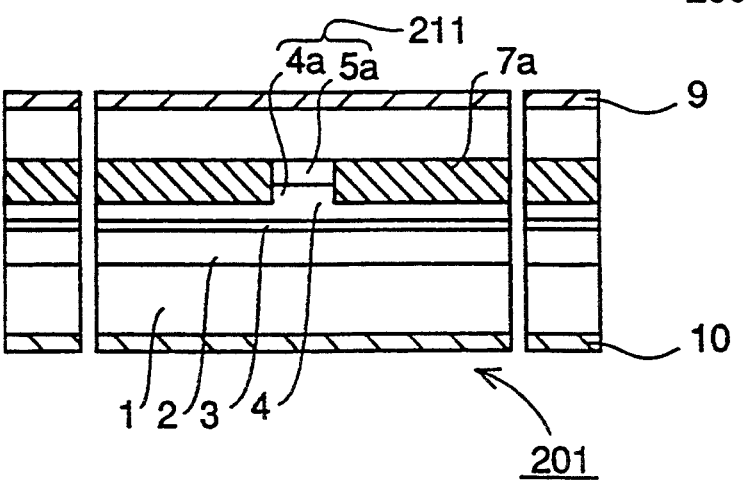

Then, after removing the SiN film 110, a p type GaAs contact layer 8 is formed (FIG. 11(a) and FIG. 12(a)), a Ti/Pt/Au front surface electrode 9 and an AuGe/Ni/Au rear surface electrode 10 are formed, and finally chip separation is performed as in the first embodiment, thereby producing a ridge type semiconductor laser chip having a window layer 103 (FIG. 11(f) and FIG. 12(f)).

As described above, in this third embodiment, an etch stopping layer 11 is formed in the course of producing the upper cladding layer, chemically reactive gas etching employing the SiN film 110 as a mask is performed so that the etching is stopped by the etch stopping layer 11 in the first to-be-processed region and the etching proceeds to below the etch stopping layer in the second to-be-processed region, in addition to the processes of the first embodiment. Accordingly, the active layer is surely exposed at the sides of the ridge and the controllability of the remaining film thickness of the upper cladding layer 4 is increased. In addition, to the effects of the first embodiment are obtained. Therefore, a semiconductor laser chip having no characteristic deterioration due to quality deterioration of the active layer and having uniform characteristics and high reliability is obtained.

While in the above-described embodiments a SiN film is employed as an insulating film serving as an etching mask and a selective growth mask, as an insulating film, for example, SiON film, SiO film or the like may be employed.

While in the above-described embodiments an etching of a semiconductor layer using HCl gas is employed, the etching of a semiconductor layer may be performed by other chemically reactive etching. For example, reactive ion etching using $Cl_2$ gas or the like may be employed.

While in the above-described embodiments a method for fabricating a semiconductor laser of AlGaAs/GaAs series material is illustrated, the present invention may be applied to fabricating a semiconductor laser of other materials, for example, InGaAs/GaAs, AlGaInP/GaAs, InGaAsP/InP system material.

As is evident from the foregoing description, according to the present invention, after forming a laminated layer structure including a double heterojunction comprising an active layer and upper and lower cladding layers on a semiconductor wafer, insulating film apertures are formed at both sides of the ridge formation region of the laser element at a first to-be-processed region including the ridge formation region and having a large insulating film aperture ratio, and an insulating film aperture is formed at a light emitting facet formation region of the laser at a second to-be-processed region including the light emitting facet formation region having a small insulating film aperture ratio, and thereafter, the insulating film aperture portions of respective to-be-processed regions are etched by chemical reactive gas etching having an increased etching rate for a reduced insulating film aperture ratio. Therefore, the active layer is not exposed at the sides of the ridge, and therefore, the characteristics of the laser element are not deteriorated due to quality deterioration of the semiconductor layer at the exposed portions.

In addition, because the ridge portion and the laser facet portion are formed at the same time, and high resistivity semiconductor layers bury both sides of the ridge and the etched concave portions of the laser facet portion by crystals grown after the etching, current blocking layers and window layers are formed in one crystal growth. Therefore, the number of crystal growths is reduced.

Furthermore, since the insulating film aperture portion of the second to-be-processed region is selectively etched to make the side surfaces of the etched concave portion laser facets and high resistivity semiconductor layers bury the etched concave portion to form window layers at the laser facet, a difficult process of growing window layers at laser facets formed by cleaving the semiconductor wafer is not needed, whereby a ridge type semiconductor laser having a window layer is easily produced.

Furthermore, because the chip separation along a direction perpendicular to the resonator length direction of the laser element is performed by cleaving, a planar, preferably mirror surface is obtained simply as a laser facet.

Furthermore, because an etch stopping layer is formed in forming the upper cladding layer and chemically reactive gas etching employing the insulating film as a mask is performed with the etching stopped at the etch stopping layer in the first to-be-processed region, the etching proceeding up to below the etch stopping layer in the second to-be-processed region, the active layer is surely not exposed to the sides of the ridge, whereby a semiconductor laser chip having no characteristic deterioration due to quality deterioration of the material constituting the active layer and having uniform characteristics and high reliability is produced.

What is claimed is:

1. A method of fabricating a semiconductor laser comprising:

forming a plurality of semiconductor layers including a lower cladding layer of a first conductivity type, an active layer, an upper cladding layer of a second conductivity type, and a cap layer of a second conductivity type successively on a semiconductor substrate of a first conductivity type including a plurality of chip regions for forming respective laser elements;

forming an insulating film on the cap layer of the second conductivity type including a first to-be-processed region corresponding to a respective chip region including a ridge formation region and a second to-be-processed region corresponding to an edge of the respective chip region;

forming apertures in the insulating film at both sides of the ridge formation region of the laser element in the first to-be-processed region having a first, relatively large insulating film aperture ratio and forming an aperture in the insulating film at a light emitting facet formation region of the laser element in the second to-be-processed region having a second, relatively small insulating film aperture ratio, smaller than the first insulating film ratio;

etching said semiconductor layers in the first and second to-be-processed regions through said insulating film apertures by chemically reactive gas etching, producing a higher etching speed for a smaller insulating film aperture ratio, thereby forming a ridge of the laser element at the first to-be-processed region and an etched groove having a side surface serving as a laser light emitting facet at the second to-be-processed region;

removing the insulating film;

forming a surface electrode over the cap layer and a rear surface electrode on the semiconductor substrate; and separating laser chips formed at the respective chip regions of the semiconductor substrate, thereby producing a ridge type semiconductor laser chip having a window layer.

2. The method of claim 1 including separating the chips by cleaving the semiconductor substrate along directions perpendicular to resonator length directions of the laser elements.

3. The method of claim 1 wherein one of the second to-be-processed regions is located between each pair of chip regions and includes window layer portions of laser elements opposite each other at adjacent chip regions on the semiconductor substrate.

4. The method of claim 3 including forming insulating film apertures at both sides of the ridge formation region of the laser element in the first to-be-processed region by patterning the insulating film and forming an insulating film aperture on an extension of the ridge formation region of the second to-be-processed region by patterning the insulating film.

5. The method of claim 3 including forming a current blocking layer and a window layer at the same time by selective growth of semiconductor layers employing the insulating film as a mask after forming the ridge.

6. The method of claim 5 including forming the insulating film as a mask for etching and selective growth by patterning an SiN film deposited on the cap layer using photolithography and etching so that a narrow insulating film portion corresponding to the ridge formation region of respective chip regions and wide insulating film portions corresponding to stripe-shaped regions outside the window layer portions of respective chip regions remain.

7. The method of claim 6 including etching the semiconductor of claim 6 including etching the semiconductor layer exposed in the insulating film apertures with HCl gas in a reduced pressure ambient of about 50 Torr.

8. The method of claim 1 including forming the second to-be-processed region outside the first to-be-processed region to include window portions at both ends of each laser element in respective chip regions on the semiconductor substrate.

9. The method of claim 8 including forming the insulating film apertures at both sides of and outside of the ridge formation region of the laser element in the first to-be-processed region and forming the insulating film apertures in the second to-be-processed region surrounding the ridge formation region and the insulating film apertures in the first to-be-processed region.

10. The method of claim 8 including forming a current blocking layer and a window layer by selective growth of semiconductor layers at the same time employing the patterned insulating film as a mask.

11. The method of claim 10 including forming the insulating film serving as a mask for etching and selective growth by patterning using photolithography and etching an SiN film deposited on the cap layer so that a narrow SiN film portion remains at the ridge formation region of respective chip regions and wide SiN film portions remain spaced apart from the narrow SiN film portion with a prescribed interval between the wide SiN film portions and the narrow SiN film portion in a direction perpendicular to the SiN film portion at both sides outside respective chip regions.

12. The method of claim 8 including chemical reactive gas etching employing the insulating film as a mask under conditions so that the etching speed in the insulating film aperture in the vicinity of the insulating film is faster than at another portion in the insulating film aperture.

13. The method claim 12 including etching the semiconductor layer exposed in the insulating film apertures with HCl gas in a reduced pressure ambient of about 200 Torr.

14. The method of claim 1 including forming a second conductivity type etch stopping layer in forming the second conductivity type upper cladding layer and employing the insulating film as an etching mask so that the etching is stopped at the etch stopping layer in the first to-be-processed region and proceeds beyond the etch stopping layer in the second to-be-processed region.

15. The method of claim 14 wherein the etch stopping layer is AlAs having an etching speed about 1/5 of that of the upper cladding layer.

* * * * *